(12) United States Patent
Banting et al.

(10) Patent No.: US 8,594,956 B2
(45) Date of Patent: Nov. 26, 2013

(54) POWER LINE ENERGY HARVESTING POWER SUPPLY

(75) Inventors: John Fredrick Banting, Waukesha, WI (US); Bruce W. McBee, Brookfield, WI (US)

(73) Assignee: Cooper Technologies Company, Houston, TX (US)

( * ) Notice: Subject to any disclaimer, the term of this patent is extended or adjusted under 35 U.S.C. 154(b) by 503 days.

(21) Appl. No.: 12/569,446

(22) Filed: Sep. 29, 2009

(65) Prior Publication Data

US 2010/0084920 A1 Apr. 8, 2010

Related U.S. Application Data

(63) Continuation-in-part of application No. 11/982,588, filed on Nov. 2, 2007, now Pat. No. 7,930,141.

(60) Provisional application No. 61/103,603, filed on Oct. 8, 2008.

(51) Int. Cl.
| | | |
|---|---|---|
| *G01R 19/00* | (2006.01) | |
| *G01R 19/15* | (2006.01) | |
| *G01R 21/06* | (2006.01) | |
| *G01R 15/18* | (2006.01) | |

(52) U.S. Cl.
USPC ............ 702/64; 702/60; 702/65; 324/127

(58) Field of Classification Search
USPC .......... 702/57–62, 64–65, 187, 188; 324/200, 324/219, 260, 511, 512, 543, 539, 414, 324/127; 340/870.02, 870.07, 870.16, 638, 340/635, 664, 660; 361/71.36, 93.2, 59; 700/293, 292, 291
See application file for complete search history.

(56) References Cited

U.S. PATENT DOCUMENTS

| 3,025,512 A | 3/1962 | Bloechl |
| 3,364,481 A | 1/1968 | Fuzzell |
| 3,460,038 A | 8/1969 | Ziegler |
| 3,700,967 A | 10/1972 | Hoss |

(Continued)

FOREIGN PATENT DOCUMENTS

WO    WO 2007/143378    12/2007

OTHER PUBLICATIONS

AA-NPL: The Institute of Electrical and Electronics Engineers, Inc., IEEE Spectrum, New Ways to Play, Electronic Music Interfaces, Dec. 1997, 3 pages.

(Continued)

*Primary Examiner* — Marc Armand
*Assistant Examiner* — Ricky Ngon
(74) *Attorney, Agent, or Firm* — King & Spalding LLP

(57) ABSTRACT

A current transforming harvester ("CTH") is capable of producing power from a conductor on a preexisting power grid without alteration of the conductor or the preexisting power grid. The CTH includes a current transformer ("CT") that captures energy via magnetic flux from the conductor. The CT is substantially circular and includes two halves called a "split core," which allow the CT to easily attach to the conductor without opening the circuit in which the conductor operates. A clamping mechanism of the CTH may secure the CTH to the conductor via a pair of spring-biased clamp pads. The CTH includes circuitry that converts the magnetic flux energy captured by the CT into electrical energy suitable for consumption by an electrical device.

24 Claims, 26 Drawing Sheets

(56) References Cited

U.S. PATENT DOCUMENTS

| | | | |
|---|---|---|---|
| 3,720,872 A | 3/1973 | Russell et al. | |
| 3,725,846 A | 4/1973 | Strain | |
| 3,735,248 A | 5/1973 | Reese | |
| 3,816,816 A | 6/1974 | Schweitzer, Jr. | |
| 3,995,243 A | 11/1976 | Malmborg | |
| 4,000,462 A | 12/1976 | Boyd et al. | |
| 4,037,155 A | 7/1977 | Ahmed | |
| 4,045,726 A | 8/1977 | Schweitzer, Jr. | |
| 4,157,520 A | 6/1979 | Moates et al. | |
| 4,165,528 A | 8/1979 | Schweitzer, Jr. | |
| 4,288,743 A | 9/1981 | Schweitzer | |
| 4,335,437 A | 6/1982 | Wilson et al. | |
| 4,384,289 A | 5/1983 | Stillwell et al. | |
| 4,456,873 A | 6/1984 | Schweitzer, Jr. | |
| 4,466,042 A | 8/1984 | Zylstra et al. | |
| 4,495,489 A | 1/1985 | Schweitzer, Jr. | |
| 4,510,476 A | 4/1985 | Clatterbuck et al. | |
| 4,558,310 A | 12/1985 | McAllise | |
| 4,593,276 A | 6/1986 | Aida et al. | |
| 4,630,218 A | 12/1986 | Hurley | |
| 4,661,813 A | 4/1987 | Mazzamauro et al. | |
| 4,686,518 A | 8/1987 | Schweitzer, Jr. | |
| 4,694,599 A | 9/1987 | Hart et al. | |
| 4,739,149 A | 4/1988 | Nishiwaki et al. | |
| 4,746,241 A * | 5/1988 | Burbank, III | 403/344 |
| 4,758,962 A * | 7/1988 | Fernandes | 702/62 |
| 4,794,332 A | 12/1988 | Schweitzer, Jr. | |
| 4,795,982 A | 1/1989 | Schweitzer, Jr. | |
| 4,799,005 A * | 1/1989 | Fernandes | 324/127 |
| 4,801,937 A | 1/1989 | Fernandes | |
| 4,847,780 A | 7/1989 | Gilker et al. | |
| 4,881,028 A | 11/1989 | Bright | |
| 4,886,980 A | 12/1989 | Fernandes et al. | |
| 4,984,124 A | 1/1991 | Yeh | |
| 5,029,039 A | 7/1991 | Yeh | |
| 5,095,274 A | 3/1992 | Brokaw | |
| 5,155,440 A | 10/1992 | Huang | |
| 5,159,319 A | 10/1992 | Dunk et al. | |
| 5,220,311 A | 6/1993 | Schweitzer, Jr. | |
| 5,241,444 A | 8/1993 | Yeh | |
| 5,258,903 A | 11/1993 | Rodriguez-Cavazos | |
| 5,440,234 A | 8/1995 | Kondo | |
| 5,475,371 A | 12/1995 | Dunk et al. | |
| 5,485,545 A | 1/1996 | Kojima et al. | |
| 5,497,096 A | 3/1996 | Banting | |
| 5,537,327 A | 7/1996 | Snow et al. | |
| 5,548,279 A | 8/1996 | Gaines | |
| 5,559,500 A | 9/1996 | Kase | |
| 5,574,387 A | 11/1996 | Petsche et al. | |
| 5,576,632 A | 11/1996 | Petsche et al. | |
| 5,629,870 A | 5/1997 | Farag et al. | |
| 5,630,954 A | 5/1997 | Toth | |
| 5,650,728 A | 7/1997 | Rhein et al. | |
| 5,661,626 A | 8/1997 | Takeuchi | |
| 5,675,497 A | 10/1997 | Petsche et al. | |
| 5,714,886 A | 2/1998 | Harris | |
| 5,726,847 A | 3/1998 | Dalstein | |
| 5,734,575 A | 3/1998 | Snow et al. | |
| 5,754,383 A | 5/1998 | Huppertz et al. | |
| 5,784,233 A | 7/1998 | Bastard et al. | |
| 5,796,631 A | 8/1998 | Iancu et al. | |
| 5,805,400 A | 9/1998 | Kim | |
| 5,945,820 A | 8/1999 | Namgoong et al. | |
| 5,959,537 A | 9/1999 | Banting et al. | |
| 6,344,748 B1 | 2/2002 | Gannon | |
| 6,535,797 B1 | 3/2003 | Bowles et al. | |
| 6,587,027 B1 | 7/2003 | Nadd | |
| 6,687,574 B2 | 2/2004 | Pietrowicz et al. | |
| 6,798,211 B1 | 9/2004 | Rockwell et al. | |
| 6,815,932 B2 | 11/2004 | Wall | |
| 7,010,437 B2 | 3/2006 | Lubkeman et al. | |
| 7,256,701 B2 | 8/2007 | Kono et al. | |
| 7,282,944 B2 | 10/2007 | Gunn et al. | |
| 7,312,686 B2 * | 12/2007 | Bruno | 336/229 |
| 7,382,272 B2 | 6/2008 | Feight | |
| 7,398,097 B2 | 7/2008 | Parkulo | |
| 7,453,267 B2 | 11/2008 | Westbrock, Jr. et al. | |
| 7,495,574 B2 | 2/2009 | Rocamora et al. | |
| 7,518,529 B2 | 4/2009 | O'Sullivan et al. | |
| 7,557,563 B2 * | 7/2009 | Gunn et al. | 324/127 |
| 7,576,548 B1 | 8/2009 | Lo et al. | |
| 7,609,158 B2 | 10/2009 | Banting et al. | |
| 7,692,538 B2 | 4/2010 | Schweitzer, III et al. | |
| 7,714,735 B2 | 5/2010 | Rockwell | |
| 7,733,094 B2 | 6/2010 | Bright et al. | |
| 2005/0017751 A1 | 1/2005 | Gunn et al. | |
| 2005/0146220 A1 | 7/2005 | Hamel et al. | |
| 2005/0151659 A1 | 7/2005 | Donovan et al. | |
| 2006/0063522 A1 | 3/2006 | McFarland | |
| 2007/0059986 A1 | 3/2007 | Rockwell | |
| 2007/0086135 A1 | 4/2007 | Swartzendruber et al. | |
| 2007/0270114 A1 | 11/2007 | Kesler et al. | |
| 2008/0001735 A1 | 1/2008 | Tran | |
| 2008/0012702 A1 | 1/2008 | Feight et al. | |
| 2008/0077336 A1 | 3/2008 | Fernandes | |
| 2008/0284585 A1 | 11/2008 | Schweitzer, III et al. | |
| 2009/0115426 A1 | 5/2009 | Muench, Jr. et al. | |
| 2009/0119068 A1 | 5/2009 | Banting | |
| 2009/0231764 A1 | 9/2009 | Banting et al. | |

OTHER PUBLICATIONS

AB-NPL: Cooper Power Systems; Fault Indicators, S.T.A.R.™ Faulted Circuit Indicators Electrostatic Reset Type, Electrical Apparatus 320-60, May 1997, 4 pages.

AC-NPL: Cooper Power Systems; Fault Indicators, S.T.A.R.™ Faulted Circuit Indicators Low Voltage Reset Type, Electrical Apparatus 320-50, May 1997, 4 pages.

AD-NPL: Cooper Power Systems; Fault Indicators, S.T.A.R.™ Faulted Circuit Indicators Test Point Reset Type, Electrical Apparatus 320-40, May 1997, 4 pages.

AE-NPL: Cooper Power Systems; Fault Indicators, S.T.A.R.™ Type ER Faulted Circuit Indicator Installation Instructions, Service Information S320-60-1, Dec. 1997, 2 pages.

AF-NPL: Cooper Power Systems; Fault Indicators, S.T.A.R.™ Type LV Faulted Circuit Indicator Installation Instructions, Service Information S320-50-1, May 1997, 4 pages.

AG-NPL: Cooper Power Systems; Fault Indicators, S.T.A.R.™ Type TPR Faulted Circuit Indicator Installation Instructions, Service Information S320-40-1, Dec. 1997, 3 pages.

AH-NPL: Cooper Power Systems; S.T.A.R.™ Faulted Circuit Indicators, Low Voltage Reset Type, Bulletin No. 97035, Jan. 1998, 2 pages.

AI-NPL: Cooper Power Systems; S.T.A.R.™ Faulted Circuit Indicators, Test Point Reset Type, Bulletin No. 97034, Jan. 1998, 2 pages.

"Examination Report from the Intellectual Property Office" dated Jan. 2, 2012, including Search Report, for related Taiwanese patent application No. 09614009 (5 pages).

"Research for Structure of Wireless Sensor Networks based on power transmission hallway", Peng Zheng et al., Engineering Journal of Wuhan University, vol. 39, No. 3, Jun. 30, 2006, pp. 12-16, cited in office action dated Nov. 9, 2011 for related Chinese patent application No. 200780048163.5 (6 pages).

* cited by examiner

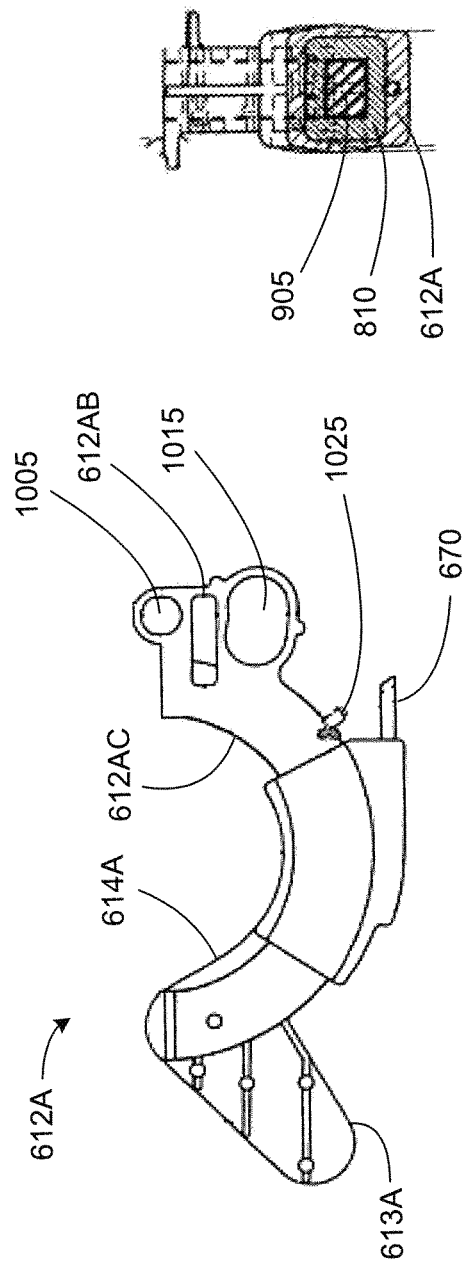

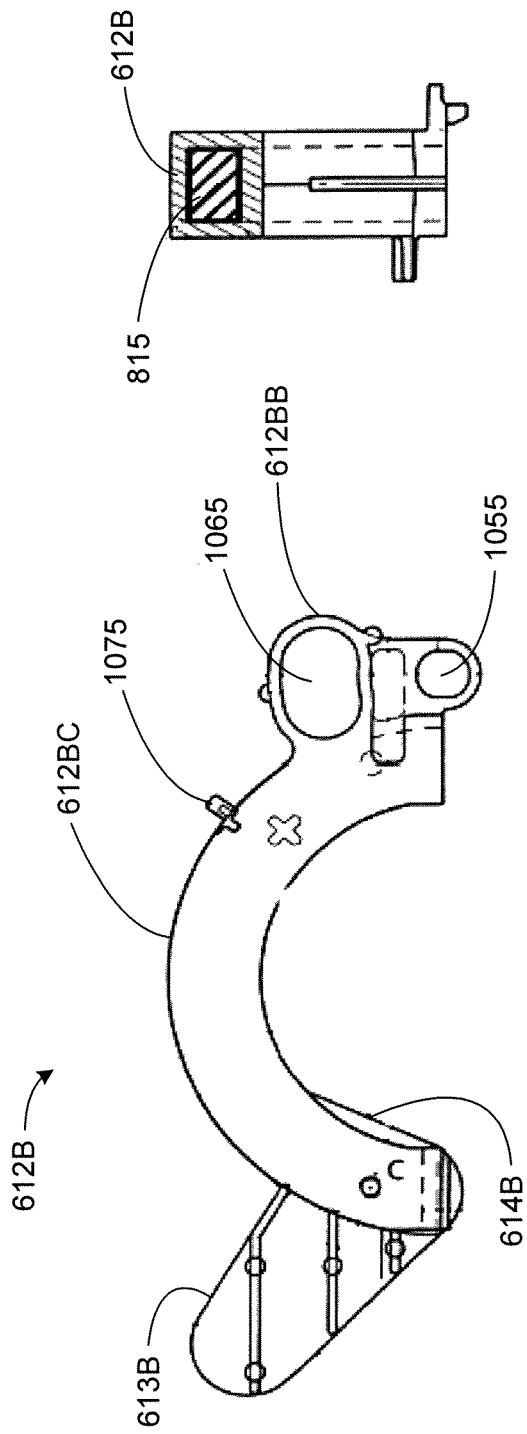

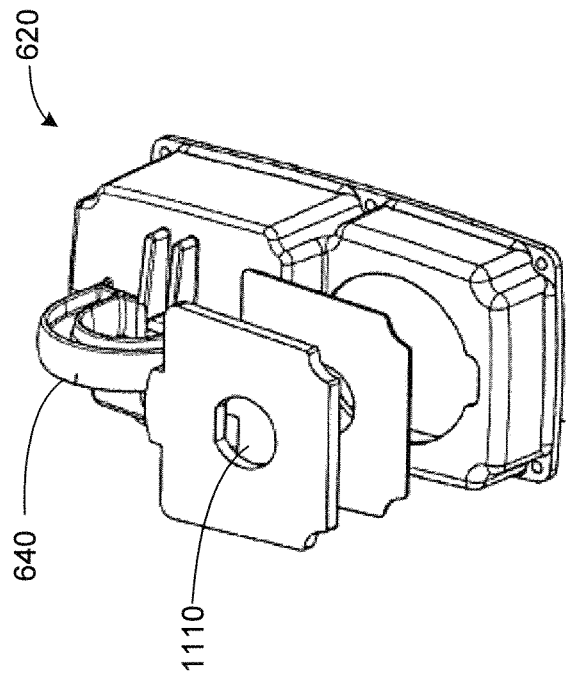
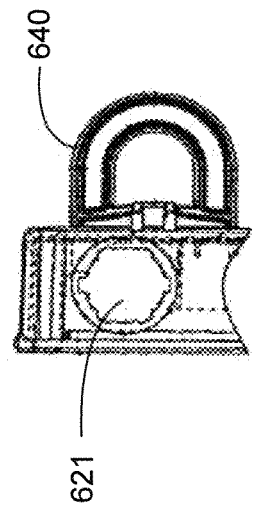
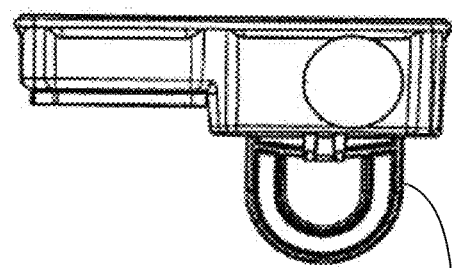
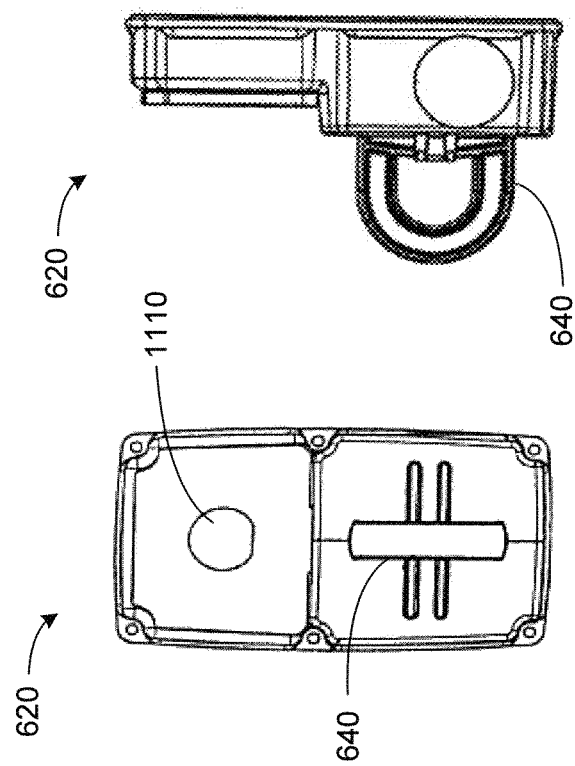
Fig. 23
Fig. 24
Fig. 22
Fig. 21

POWER LINE ENERGY HARVESTING POWER SUPPLY

RELATED PATENT APPLICATIONS

This non-provisional patent application is a continuation-in-part of U.S. patent application Ser. No. 11/982,588, entitled "Communicating Faulted Circuit Indicator Apparatus And Method Of Use Thereof," filed Nov. 2, 2007 now U.S. Pat. No. 7,930,141. This application also claims priority under 35 U.S.C. §119 to U.S. Provisional Patent Application No. 61/103,603, entitled "Power Line Energy Harvesting Power Supply," filed Oct. 8, 2008. This application is related to U.S. patent application Ser. No. 12/569,343, entitled "Overhead Communicating Device," filed on Sep. 29, 2009. The complete disclosure of each of the foregoing priority and related applications is hereby fully incorporated herein by reference.

TECHNICAL FIELD

The invention relates generally to powering electrical components, and more particularly to reliably and cost-effectively powering a device on an electrical power line by harvesting power from the power line.

BACKGROUND

The implementation of devices placed on an electric power grid has expanded as utilities move to add intelligent devices to their networks. The devices that are being integrated may monitor, control, meter, communicate, or perform a number of other functions with respect to components of the grid. For example, power line communication repeaters are often used in rural areas to transmit information from an automatic metering infrastructure (AMI).

Power line communication repeaters and other communication devices on power lines require power to operate. However, a power source is not generally available or convenient to power these devices or their communication radios. Traditional approaches to powering these devices have involved the use of batteries, solar cells, and/or power transformers.

These power sources are unreliable and expensive. Batteries have limited power ability and cannot provide the ongoing power required for most devices on power lines. Solar cells can replenish power in storage devices. However, due to contamination, length of days, weather, snow, and many other factors, solar cells are unreliable and are not durable enough to survive in a power line environment. While power transformers are generally reliable, they are prohibitively expensive. In addition, since most electronic devices do not require significant power to operate, the installation of a power transformer is extremely inefficient.

Therefore, a need exists in the art for an improved power source for a device on an electrical power line. In particular, a need exists for a reliable, cost-effective power supply for a communications device on an electrical power line.

SUMMARY

A power line monitoring device can include a current transforming harvester ("CTH") which can easily be secured to an electrical conductor on a preexisting power grid without compromising the integrity of the electrical conductor or the power grid. The CTH includes a current transformer ("CT") that captures energy via magnetic flux from the conductor to which it is secured. Circuitry associated with the CT converts the energy captured by the CT into energy that may be used by one or more other electrical devices. For example, the energy may power a sensor, monitor, radio, and/or other device associated with the CT and/or the conductor.

The CT is substantially circular in shape and includes two halves called a "split core," which allow the CT to be easily attached to the conductor without having to open the circuit in which the conductor operates. Each of the halves is referred to herein as a "split core section." One of the split core sections can include a winding of an electrical wire that is wrapped around a member of the split core section. An alternating current in the conductor can generate a magnetic field around the conductor and through the winding of the split core section when the CT is attached to the conductor. The CT can utilize the magnetic field to form an induced current on the winding. An electrical connector of the CTH can route this induced current to the circuitry.

The circuitry can include a pre-regulator circuit that receives the current from the CT and develop a voltage matched to a power curve of the CT. An output of the pre-regulator is coupled to a switching regulator that can regulate the voltage to an output voltage suitable for an electrical device, such as a communications device or other device. The circuitry also can include an energy storage device, such as a rechargeable battery or a supercapacitor, that can provide power to the electrical device when the conductor is not supplying an adequate amount of energy. The energy storage device can be connected to the output of the pre-regulator to allow the energy device to charge when the electrical device is drawing less power than the CT is harvesting.

A clamping mechanism of the CTH may secure the CTH to the conductor via a pair of spring-biased clamp arms. The clamping mechanism can include an actuator arm that holds the clamp arms open to receive the conductor and releases the clamp arms to close onto and substantially around the conductor. Each clamp arm can include a clamp pad having clamp slots that help to minimize the motion of the conductor with respect to the CTH. Each clamp arm can include a means for installing clamp pads of various sizes to allow the CTH to attach to different-sized conductors.

The CTH and its associated circuitry can withstand harsh environments to provide reliable operation. For example, the CT and other components of the CTH may be enclosed via a molding process, which also can provide various mechanical means to allow the CT to open and surround the electrical conductor. In addition, a housing of the CTH may encapsulate the circuitry associated with the CT to protect the circuitry and other components from the environment. At least some of the components of the CTH may be constructed from material that can withstand exposure to rain, ice, snow, sun, wind, and other environmental conditions.

In one embodiment, an energy harvesting device for harvesting energy from a power line conductor includes a current transformer having an electrical winding disposed thereon and configured to receive an induced current on the electrical winding via magnetic flux energy generated by alternating current on the power line conductor; and a circuit electrically coupled to the electrical winding and configured to convert the received induced current into an electrical energy for consumption by an electrical device.

In another embodiment, a method for powering an electrical device using energy captured from a power line by a CTH without modifying the power line includes receiving an induced alternating current on an electrical winding from a magnetic field generated by an electrical current flowing in the power line, the electrical winding disposed on a current transformer; routing the induced alternating current to a rectifier circuit coupled to the winding; converting by the rectifier circuit the induced alternating current into a direct current; regulating by a switching regulator a voltage level associated with the direct current to a voltage level of the electrical device; and routing the direct current at the voltage level to the electrical device.

These and other aspects, objects, features, and embodiments of the invention will become apparent to a person of ordinary skill in the art upon consideration of the following detailed description of illustrative embodiments exemplifying the best mode for carrying out the invention as presently perceived.

BRIEF DESCRIPTION OF THE DRAWINGS

For a more complete understanding of the invention and the advantages thereof, reference is now made to the following description, in conjunction with the accompanying figures briefly described as follows.

FIG. 11, which comprises

FIG. 17 is a front view of a first CT arm of the monitoring device of FIG. 6, in accordance with certain exemplary embodiments.

FIG. 18 is a side cross-sectional view of the CT arm illustrated in FIG. 17, in accordance with certain exemplary embodiments.

FIG. 19 is a front view of a second CT arm of the monitoring device of FIG. 6, in accordance with certain exemplary embodiments.

FIG. 20 is a side cross-sectional view of the CT arm illustrated in FIG. 19, in accordance with certain exemplary embodiments.

FIG. 21 is a front elevation view of a monitoring device housing of the monitoring device of FIG. 6, in accordance with certain exemplary embodiments.

FIG. 22 is a side elevation view of the monitoring device housing illustrated in FIG. 21, in accordance with certain exemplary embodiments.

FIG. 23 is a perspective side view of the monitoring device housing illustrated in FIG. 21, in accordance with certain exemplary embodiments.

FIG. 24 is a side cross-sectional view of a portion of the monitoring device housing illustrated in FIG. 21, in accordance with certain exemplary embodiments.

DETAILED DESCRIPTION OF EXEMPLARY EMBODIMENTS

The exemplary embodiments provide a power line monitoring device that includes a current transforming harvester ("CTH") capable of producing power from a conductor on a preexisting power grid without alteration of the conductor or the preexisting power grid. The CTH includes a current transformer ("CT") that captures energy via magnetic flux from the conductor. The CT is substantially circular and includes two halves called a "split core," which allow the CT to easily attach to the conductor without opening the circuit in which the conductor operates. A clamping mechanism of the CTH may secure the CTH to the conductor via a pair of spring-biased clamp pads. The CTH includes circuitry that converts the magnetic flux energy captured by the CT into electrical energy suitable for consumption by an electrical device.

Figure 1:
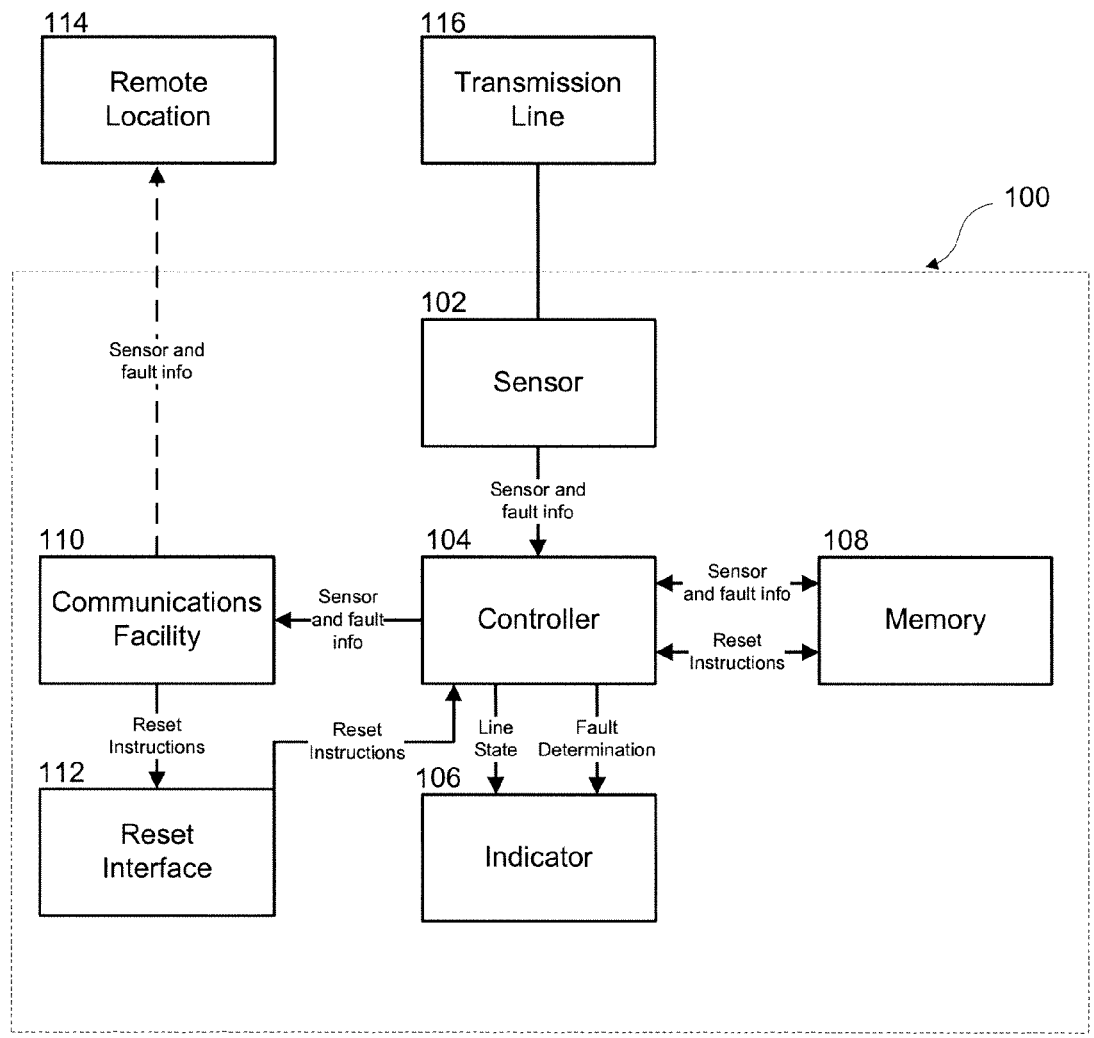
FIG. 1 is a block diagram depicting a power line monitoring device, in accordance with certain exemplary embodiments.

Turning now to the drawings, in which like numerals indicate like elements throughout the figures, exemplary embodiments are described in detail. FIG. 1 is a block diagram depicting a power line monitoring device 100, in accordance with certain exemplary embodiments. The monitoring device 100 is electrically connected to a power line 116. The term "power line" is used herein to refer to any type of electrical conductor that transmits electricity from one location to another. For example, the power line 116 can include one or more utility cables, whether above ground, underground, or otherwise.

Generally, the connection between the monitoring device 100 and the power line 116 is provided by a clamping mechanism that ensures a strong connection between the monitoring device 100 and the power line 116. The monitoring device 100 can be powered in a variety of ways. In certain exemplary embodiments, the monitoring device 100 can be powered by a magnetic field generated by the power line 116 to which the monitoring device 100 is connected, along with a battery that can power the monitoring device 100 should current in the attached power line 116 be interrupted. Alternative power supplies include, but are not limited to, solar power, vibration, radio frequency energy, thermal energy, current passing through the power line 116, a rechargeable battery or supercapacitor that harvests energy from the current in the power line by using a current transformer, or by utilizing the reference voltage from an energized conductor to an adjacent ground.

The monitoring device 100 comprises a sensor 102 that measures conditions on the power line 116. In certain exemplary embodiments, the sensor 102 can measure in real time or near-real time the current and voltage on the power line 116. In certain alternative exemplary embodiments, other types of sensors 102 can be used that are capable of measuring any suitable parameter for conditions that can be present on the power line 116 or the monitoring device 100 itself, including but not limited to, line temperature, line tilt, ambient temperature, wind speed, liquid levels of electrical components, dissolved gas content or pressure from a monitored transformer, battery status, frequency, harmonics, zero crossings, vibration, and/or power factor. The sensor 102 can be configured to measure one or more conditions. In certain exemplary embodiments, two or more sensors 102 can be combined to measure multiple conditions. The sensor 102 communicates the measurements to a controller 104. The term "sensor data" is used herein to refer to any information provided from the sensor 102, including any measurements provided from the sensor 102 to the controller 104. In certain exemplary embodiments, the monitoring device 100 can be electrically connected to a neutral line (not shown) and the sensor 102 can comprise a current sensor for finding current imbalances.

The controller 104 analyzes the sensor data it receives and takes appropriate actions in response to the data. In certain exemplary embodiments, the controller 104 includes a microcontroller programmed to analyze the sensor data and to respond appropriately. In certain alternative exemplary embodiments, the controller 104 includes any suitable control mechanism capable of receiving sensor data and controlling peripheral systems, such as a memory 108, a communications facility 110, and an indicator 106. For example, the controller 104 can comprise any combination of analog and/or digital electronics capable of establishing that a fault event has occurred.

In certain exemplary embodiments, the controller 104 can be programmed to recognize certain changes in the sensor data as fault events. For example, the controller 104 can treat a drop in current in excess of a programmed threshold as indicative of the existence of a fault. However, the controller 104 can be programmed to identify any condition that occurs on the power line 116 as indicative of a fault. For example, the controller 104 can be programmed to identify a surge in current or voltage in excess of a predetermined threshold, a temperature reading in excess of a predetermined threshold, and/or vibration in excess of a predetermined threshold as a fault. The thresholds can be defined by a utility company employing the monitoring device 100 in an electrical transmission or distribution system and can vary based on conditions in a particular area. If the controller 104 determines that a fault has occurred, it can communicate that fact to an indicator 106, a memory 108, and/or a communications facility 110 of the monitoring device 100. In certain alternative exemplary embodiments, the sensor 102 can comprise circuitry for determining whether a fault condition has occurred and for notifying the controller 104 of the fault event.

In embodiments where the controller 104 receives sensor data from the sensor 102, the controller 104 can be further programmed to identify certain other data that can be valuable to a utility company in diagnosing problems or inefficiencies in a transmission or distribution system. The controller 104 can be configured to record data in the memory 108 for later analysis by the utility company, a line technician, or another interested party. By way of example, an increase in temperature on a power line 116 may not result in a fault event, but may indicate that the power line 116, or some of its nearby equipment such as transformers, capacitors, capacitor banks, circuit breakers, and fuses, has developed a flaw that is creating additional resistance on the power line 116 and reducing efficiency. Similarly, the controller 104 can be programmed to monitor the zero crossings that occur on the power line 116 over a certain period of time. Information relating to zero crossings can be used to identify harmonics and momentaries that potentially indicate an unstable condition. Because the controller 104 (and/or sensor 102) has identified the condition before a fault has occurred, the utility company can determine whether remedial action is necessary to improve the performance of the transmission system or to prevent a fault that may result in a loss of power to the utility company's customers.

The controller 104 can be further programmed to identify data relating to the monitoring device 100 itself and to record that data in the memory 108. For example, the controller 104 can identify and record battery status, geographic coordinates, ambient temperature, wind speed, liquid levels, dissolved gas content, pressure, and/or any other suitable data that may be of interest to a utility company.

The controller 104 can be further configured to communicate fault determinations to an indicator 106 and to communicate fault determinations and sensor data to a communications facility 110. If, as described above, the controller 104 (and/or sensor 102) determines that a fault event has occurred, then the controller 104 can communicate that information to an indicator 106. Further, without regard to whether a fault event has been established, the controller 104 can communicate sensor data to the memory 108 or to a communications facility 110.

For example, the controller 104 can be programmed to transmit sensor data from the sensor 102 after the passage of a set period of time—for example, once per day—without regard to the data's contents. Such programming would allow a utility company to have frequent updates regarding the performance of the transmission or distribution system. The controller 104 also can be programmed to store sensor data after the passage of a set period of time—for example, once per hour—and then to transmit the stored information over a different period of time—for example, once per day. The controller 104 can also be programmed to synchronize to other sensors deployed along the power line 116 or distribution system in order to provide an accurate snapshot of the entire power line 116 or distribution system at synchronized times throughout the day. The periodicity of recording and transmitting of sensor data is at the discretion of the utility company to meet the particular needs of the environment in which the monitoring device 100 is deployed. The controller 104 also can be programmed to transmit any sensor data that meets any of the fault or storage conditions described above.

The indicator 106 can be a display that is mounted on the monitoring device 100 and situated such that it can be viewed from a distance. Thus, the indicator 106 can provide a visible indication that a fault has occurred. In certain exemplary embodiments, the indicator can comprise a high visibility display device. However, the indicator alternatively can be a liquid crystal display (LCD) or other similar display device. Additionally, the indicator 106 can emit an audible sound that can alert a technician in the general vicinity of the monitoring device 100 that the monitoring device 100 has detected a fault condition. The audible indicator 106 can be in addition to, or an alternative to, a visible indicator 106.

The memory 108 can be any suitable storage device, such as flash memory or dynamic random access memory (DRAM). If the controller 104 determines that sensor data should be recorded, such as when the data represents an unusual condition or a fault, the controller 104 can record that data in the memory 108, and can optionally record information that relates to the data, such as the time the data was measured, the geographic coordinates of the FCI that recorded the data, the ambient conditions at the time the data was recorded, or any other data that the FCI has measured or recorded.

The memory 108 also can store information that relates to the monitoring device 100. For example, in certain exemplary embodiments, upon installation, the memory 108 can be programmed with the global coordinates of the monitoring device 100. Alternatively, the memory 108 can store other identifying information, such as, but not limited to, the street address of the installation, a unique identifier for the monitoring device 100, grid coordinates, or an identifier for a nearby utility pole or other landmark.

The communications facility 110 provides a system that is capable of transmitting data to a remote location 114. In certain exemplary embodiments, the communications facility 110 communicates with the remote location 114 using cellular technologies, such as GSM (Global System for Mobile communications) or CDMA (Code Division Multiple Access). The communications facility 110 also can include components for any number of wireless or wired communications protocols, including, but not limited to, any of the 802.11 standards, Bluetooth (IEEE 802.15.1), ZigBee (IEEE 802.15.4), Internet Protocol, licensed or un-licensed radio, fiber, or power line carrier communications technologies. The communications facility 110 can provide the function of communicating sensor data to a remote location 114.

In certain exemplary embodiments, the remote location 114 can be related to a utility company's central office and has the capability of simultaneously monitoring communication feeds from numerous monitoring devices 100 and communicating information from those feeds to an entity or individual that is responsible for repair and maintenance to the transmission or distribution system. In this embodiment, the remote location 114 comprises a central server that is connected to a utility company's outage management system. Upon receiving communication of fault or sensor data, the server then processes the information and translates the data format as necessary into an appropriate format such as, but not limited to, Distributed Network Protocol (DNP), Inter-Control Center Communications Protocol (ICCP), Multispeak, or other communications protocols. The server then transmits the information to the outage management system, where it can be viewed on the utility company consoles. Either the server or the outage management system also can provide direct communications to individuals who can address the problem. For example, upon receiving information relating to a fault, the system can automatically direct an electronic mail message or telephone call to a line technician in the area, who can receive the message on a mobile communications device, such as a wireless phone, personal digital assistant, or other suitable communications device.

In certain alternative exemplary embodiments, the remote location 114 can comprise a system capable of generating information that is accessible by the utility company, such as a World Wide Web page that graphically displays information to the viewer. In this embodiment, upon receiving a communication of fault or sensor data, the server generates a web page that, if accessed, displays some or all of that information to the viewer. Utility company representatives can then visit the web page to retrieve the data. The server in this embodiment also can provide communications to individuals via telephone or electronic mail message, as described with respect to the previous exemplary embodiment.

In another alternative embodiment, the remote location 114 can be a communications device, such as a cellular telephone or a personal digital assistant (PDA). The remote location also can be any location accessible via the Internet, such as an electronic mail address. In this embodiment, the communications facility 110 uses cellular communications to communicate directly with the remote location 114 via telephone, short message service (SMS) message, or electronic mail. In this embodiment, the monitoring device 100 can provide direct notice to individuals who are in a position to address any concerns that raised by the communication.

The communications facility 110 also can facilitate communications between two or more monitoring devices 100. This embodiment is especially advantageous when multiple monitoring devices 100 are located within a short distance of one another. By way of example only, it may be desirable to install three monitoring devices 100 on a single three-phase power line, such that one monitoring device 100 monitors each individual phase. In such an implementation, it can be desirable to implement cellular communications in the communications facility 110 of one of the monitoring devices 100. The monitoring devices 100 then communicate with one another using a short range wireless protocol, such as Bluetooth, WiFi, or ZigBee, or a wired protocol, such as power line carrier networking. If one of the monitoring devices 100 in which cellular communications is not installed detects a fault condition, or determines that sensor data should be transmitted to a remote location using cellular communications, that monitoring device 100 can transmit to the cellular-enabled monitoring device 100 using the short range wireless protocol or the wired protocol, and the cellular-enabled monitoring devices 100 can relay the transmission to the remote location 114. This multiple monitoring device 100 embodiment is also applicable to monitoring devices 100 located in close proximity to each other on different power lines or other equipment. "Close proximity" can be within the communications distance of the short range wireless protocol or the wired protocol.

In exemplary embodiments, a reset interface 112 can have two distinct reset instructions for the monitoring device 100: an indicator reset and a memory reset. The indicator reset instruction removes a fault indication, while the memory reset instruction clears at least some of the sensor data from the memory 108. The memory reset instruction can comprise parameters that indicate the portions of the memory to be cleared. For example, the memory reset instruction can specify that only sensor data recorded before a certain date should be cleared, that all sensor data should be cleared, that sensor data and information relating to the monitoring device 100 should be cleared, that all data other than information relating to the monitoring device 100 should be cleared, and/or other suitable parameters that identify which memory should be erased. While both the indicator reset and the memory reset instructions can be triggered by the same event, it may be desired in some instances to reset one or the other in isolation.

For example, in certain exemplary embodiments, the controller 104 can be programmed to respond to the resumption of proper current flow after a fault event by issuing an indicator reset instruction but not a memory reset instruction. In this mode of operation, a record of the fault event, as well as the conditions that accompanied the event, will remain in memory 108 even though the fault indicator 106 has been cleared. The information can then be downloaded from the memory 108 and analyzed, and the monitoring device 100 will not indicate a fault situation when none presently exists. Thus, the invention can provide automatic reset when proper current flow resumes, while also storing data that can be used to diagnose and locate transient or intermittent faults.

Additionally, the reset interface 112 can receive reset instructions directly from a technician that is "on-site." In certain exemplary embodiments, the technician provides reset instructions by activating one or more buttons (not shown) on the monitoring device 100 or a keyboard (not shown) connected to the monitoring device 100. In certain alternative exemplary embodiments, reset instructions can be provided via switches or other common input techniques such as from a computer, PDA, or a cellular telephone.

In certain exemplary embodiments, the sensor 102, controller 104, memory 108, communications facility 110, and reset interface 112 can be provided inside a weatherproof housing, while the indicator 106 is disposed on the outer surface of the housing such that the indicator 106 can be viewed from a distance. In certain alternative exemplary embodiments, each component can be disposed either inside or outside the housing. The housing can be clamped to the power line 116 with a clamping mechanism, and the sensor 102 can be logically coupled to a portion of the clamping mechanism.

Figure 2:
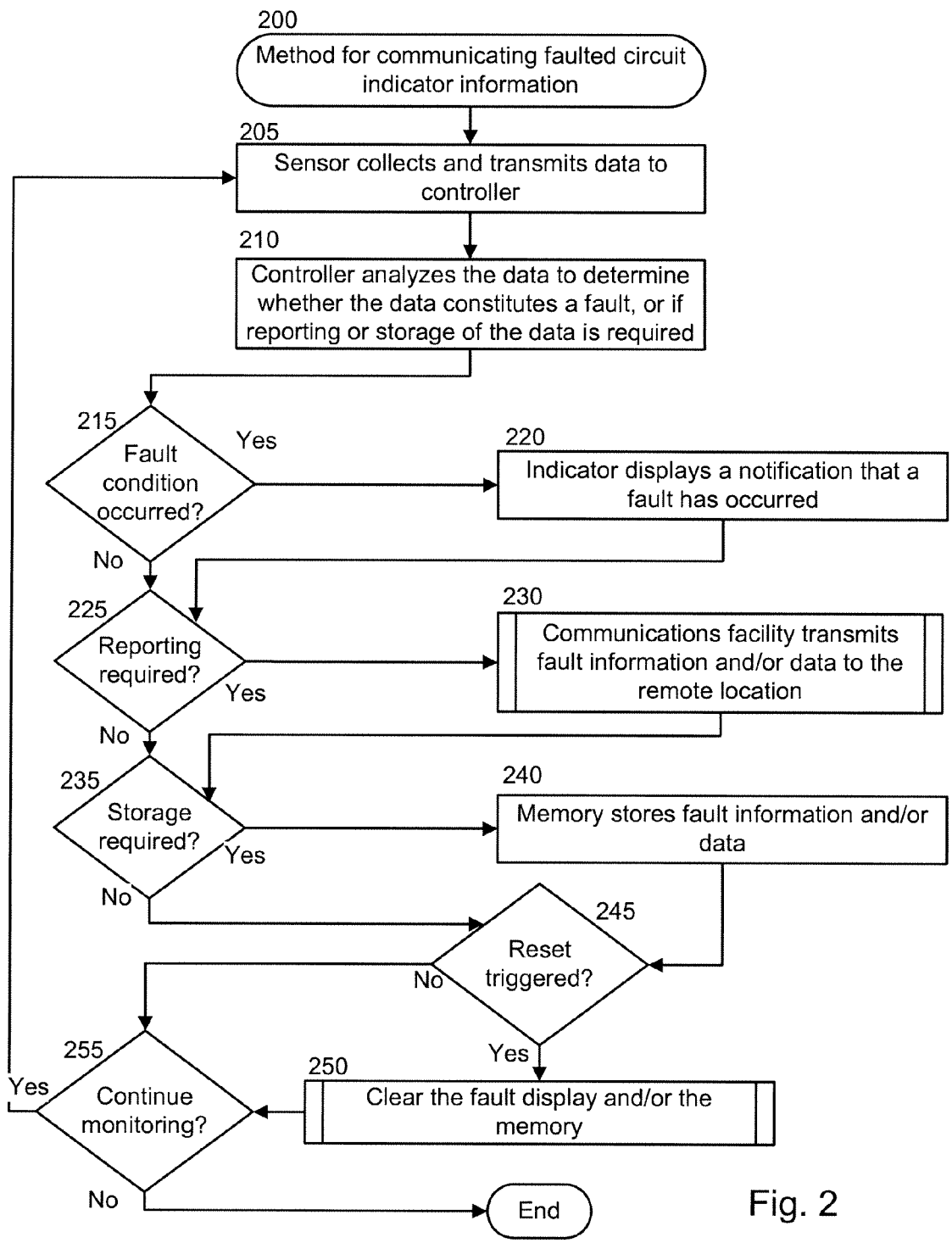
FIG. 2 is a flow chart illustrating a method for communicating faulted circuit indicator information using the power line monitoring device of FIG. 1, in accordance with certain exemplary embodiments.

FIG. 2 is a flow chart illustrating a method 200 for communicating faulted circuit indicator information using the monitoring device 100 of FIG. 1, in accordance with certain exemplary embodiments. The method 200 will be described with reference to FIGS. 1 and 2.

In step 205, the sensor 102 collects data from the power line 116, the monitoring device 100, or its surroundings. In step 210, the controller 104 analyzes the collected data to determine whether the collected data constitutes a fault, whether the data should be reported, and/or whether the data should be stored in memory 108.

In step 215, the controller 104 determines whether a fault condition has occurred based on the analysis conducted in step 210. If the controller 104 determines in step 215 that a fault condition has occurred, then the method 200 branches to step 220. In step 220, the controller 104 communicates the presence of the fault condition to the indicator 106, which displays an indication that a fault has occurred. The method 200 then proceeds to step 225.

Referring back to step 215, if the controller 104 determines that a fault condition did not occur, then the method 200 branches directly to step 225.

In step 225, the controller 104 determines whether the collected data and/or the fault condition is such that reporting is required. In certain exemplary embodiments, the controller 104 can be programmed to make this determination based on the data itself, or based on other factors, such as the passage of a set period of time, or a direct demand from the utility company. If reporting is required, then the method 200 branches to step 230, wherein the controller 104 communicates the sensor data and/or the fault information, together with a communication instruction, to the communications facility 110, which transmits the collected data and/or the fault information to the remote location 114. Step 230 will be described in further detail hereinafter with reference to FIG. 3. The method 200 then proceeds to step 235.

Referring back to step 225, if the controller 104 determines that the data should not be reported, the method 200 branches directly to step 235.

In step 235, the controller 104 determines whether the collected data and/or fault information should be stored in the memory 108. The determination can be made based on the controller's programming, as described above with respect to FIG. 1. If yes, then the method 200 branches to step 240, wherein the controller 104 stores the collected data and/or fault information in the memory 108. The method 200 then proceeds to step 245.

Referring back to step 235, if the controller 104 determines that storage is not required, then the method 200 branches directly to step 245.

In step 245, the controller 104 determines whether a reset has been triggered. If a reset has been triggered, the method 200 branches to step 250, wherein the controller 104 can clear the fault indication, the memory 108, or both. The reset procedure of step 250 is discussed in further detail hereinafter with reference to FIG. 4.

The method 200 then proceeds to step 255. Referring back to step 245, if the controller 104 determines that a resent has not been triggered, then the method 200 branches directly to step 255.

In step 255, the controller 200 determines whether to continue monitoring the power line 116. If yes, then the method 200 branches back to step 205. If not, then the method 200 ends.

Figure 3:
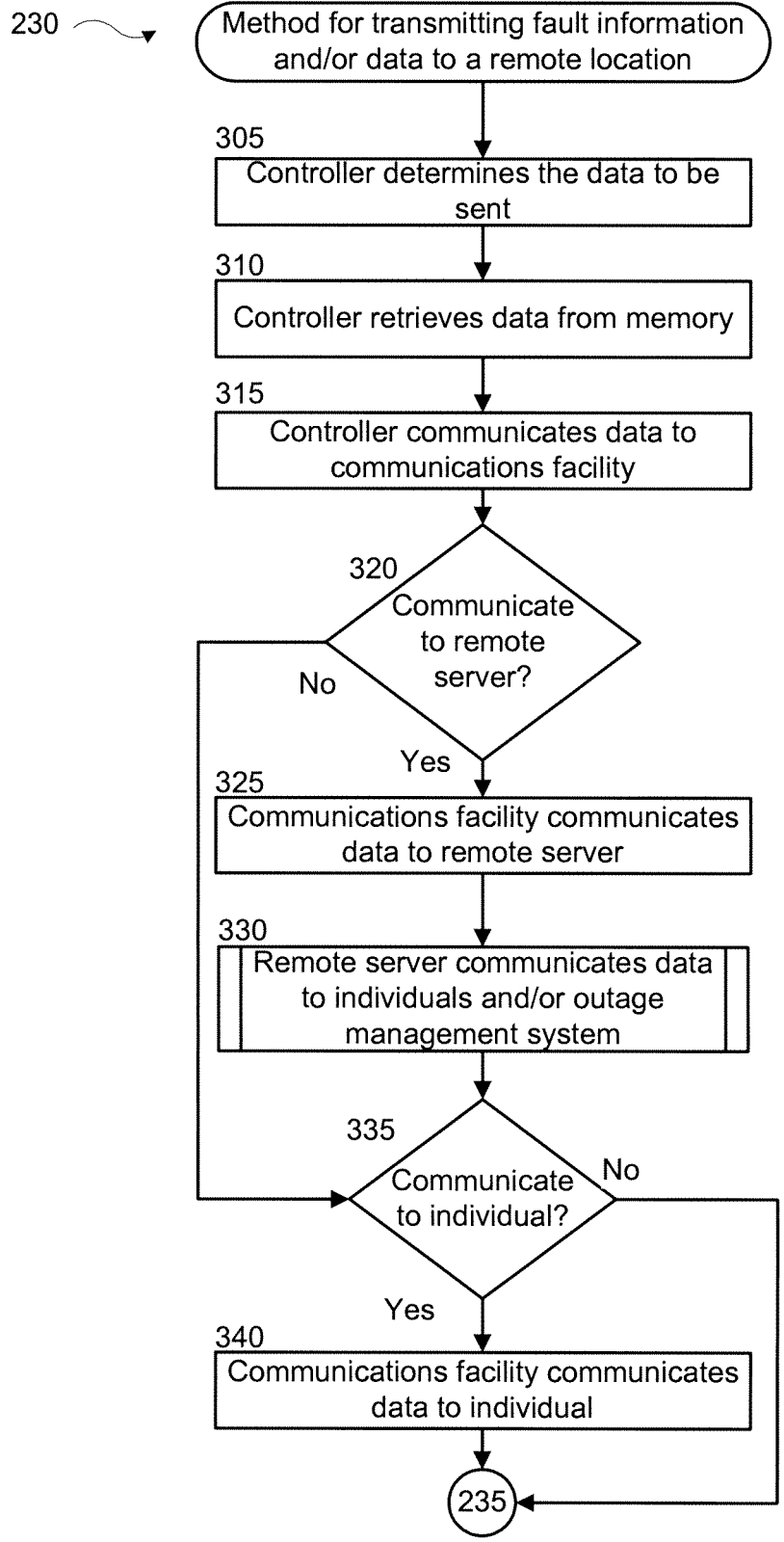
FIG. 3 is flow chart illustrating a method for transmitting information from the power line monitoring device of FIG. 1 to a remote location, in accordance with certain exemplary embodiments.

FIG. 3 is flow chart illustrating a method 230 for transmitting information from the power line monitoring device 100 to the remote location 114, in accordance with certain exemplary embodiments. For example, the method 230 can be used to transmit fault information and/or data to the remote location 114, as referenced in step 230 of FIG. 2. The exemplary method 230 will be described with reference to FIGS. 1 and 3.

In step 305, the controller 104 determines, based on its programming, the data to be transmitted. For example, this data can include information relating to a fault, if a fault event triggered the transmission. The data also can relate to measurements of the sensor 102, or other information relating to the monitoring device 100, such as its global coordinates.

In step 310, if any of the data to be transmitted resides in the memory 108, the controller 104 retrieves that data. In step 315, the controller 104 transmits the data to the communications facility 110.

In step 320, the controller 104 determines, based on its programming, whether the data should be transmitted to a remote server or other similar system. If the controller 104 determines that data should not be transmitted to a remote server, the method 230 branches to step 335. If, however, the controller 104 determines in step 320 that data should be transmitted to a remote server, then the method 230 branches to step 325, wherein the communications facility 110 transmits the data to a remote server. In certain exemplary embodiments, the data transmission is performed with cellular communications, although in other embodiments, the transmission may be by any of the wireless or wired transmission protocols described above with respect to FIG. 1. The method 230 then proceeds to step 330.

In step 330, the remote server communicates data to individuals or a utility company's outage management service to allow the individual or utility company to respond to the data. The communicating feature of step 330 is discussed in further detail hereinafter with respect to FIG. 5. The method 230 then proceeds to step 335.

In step 335, the controller 104 determines, based on its programming, whether the data should be transmitted to an individual, such as a line technician. If the controller 104 determines that data should not be transmitted to an individual or individual(s), then the method returns to step 235 of FIG. 2. If, however, the controller 104 determines that the data should be transmitted to an individual, then the method 230 branches to step 340, wherein the communications facility 110 uses a cellular protocol to transmit the data to an individual or individual(s). For example, the communications facility 110 could place a telephone call to the individual or individual(s). However, in certain exemplary embodiments, the communications facility 110 can send a text message or electronic mail message directly to a cellular enabled device or device(s), such as a telephone or a personal digital assistant. The method 230 then proceeds to step 235 of FIG. 2.

Figure 4:
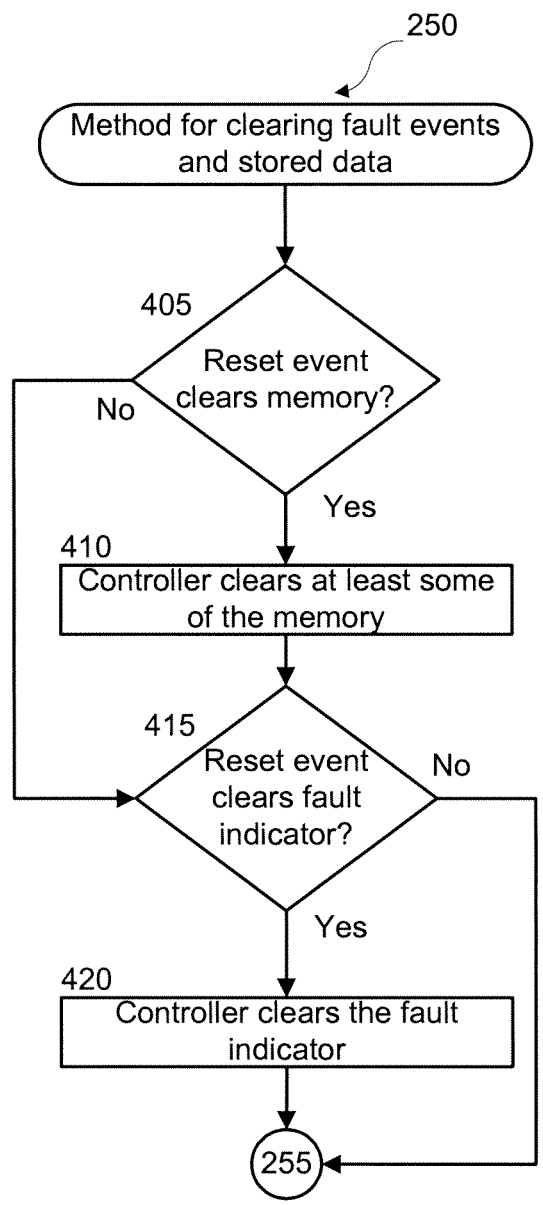
FIG. 4 is a flow chart illustrating a method for clearing fault events and line state history, in accordance with certain exemplary embodiments.

FIG. 4 is a flow chart illustrating a method 250 for clearing fault events and line state history according to certain exemplary embodiments, as referenced in step 250 of FIG. 2. The method 250 will be described with reference to FIGS. 1 and 4.

In step 405, the controller 104 determines, based on its programming, whether a reset signal instructs clearing the memory 108. As described above, a variety of events can trigger a reset, and a utility company can desire to have some events reset at least a portion of the memory 108, while others reset only the fault indication. If the controller 104 determines that the received reset signal does not instruct resetting the memory 108, then the method 250 proceeds to step 415.

If, however, the controller 104 determines that the received reset signal does instruct resetting the memory 108, then the method 250 branches to step 410, wherein the controller 104 clears at least a portion of the data from the memory 108, based on the instructions in the reset signal. The method 250 then proceeds to step 415.

In step 415, the controller 104 determines whether the reset signal instructs clearing the fault indicator 106. If the controller 104 determines that the received reset signal does not instruct resetting the fault indicator 106, then the method 250 branches to step 255 of FIG. 2.

If, however, the controller 104 determines that the received reset signal instructs resetting the fault indicator 106, the method 250 branches to step 420, wherein the controller 104 clears any indication that a fault has occurred from the fault indicator 106. After clearing the fault indication, the method 250 proceeds to step 255 of FIG. 2.

Figure 5:
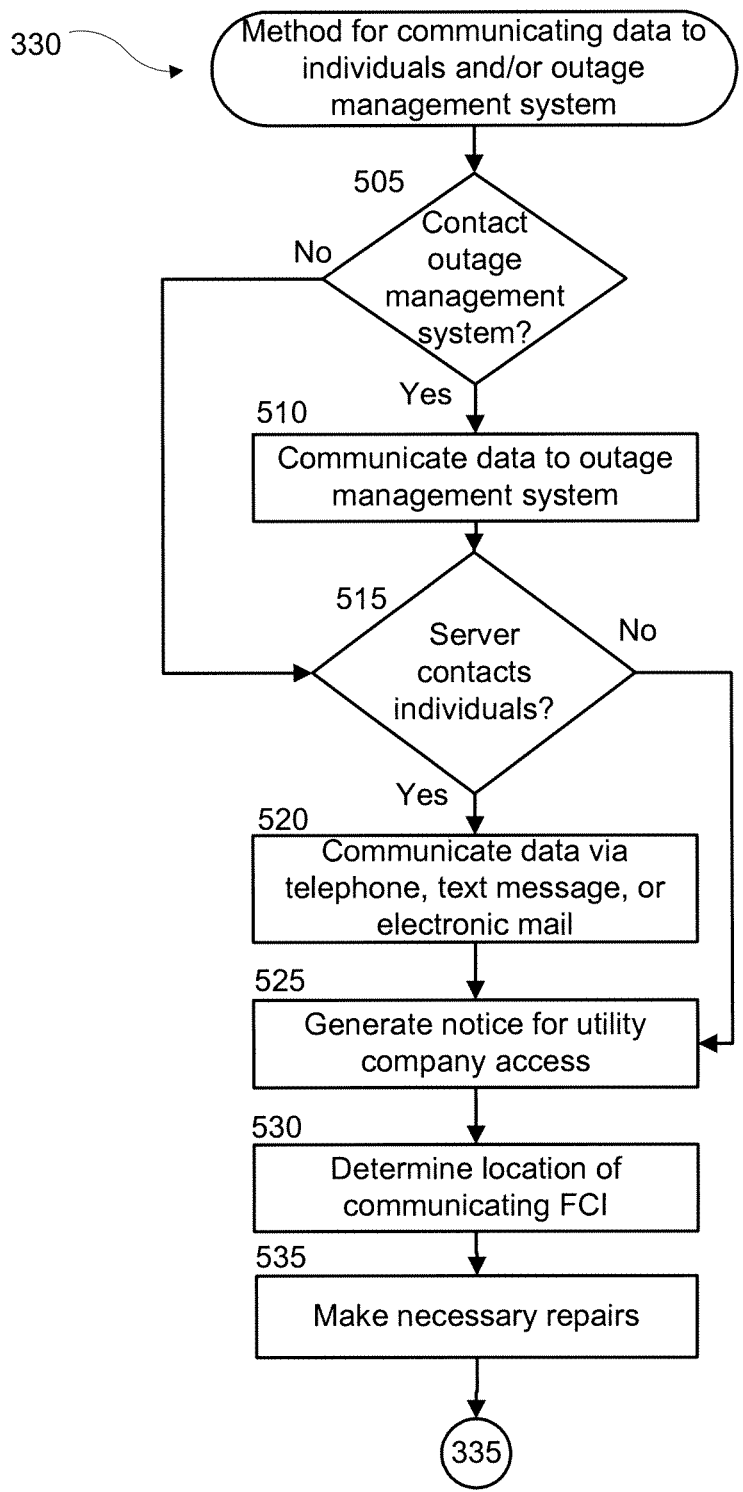
FIG. 5 is a flow chart illustrating a method for communicating data from the power line monitoring device of FIG. 1 to individuals and/or an outage management system, in accordance with certain exemplary embodiments.
Figure 6:
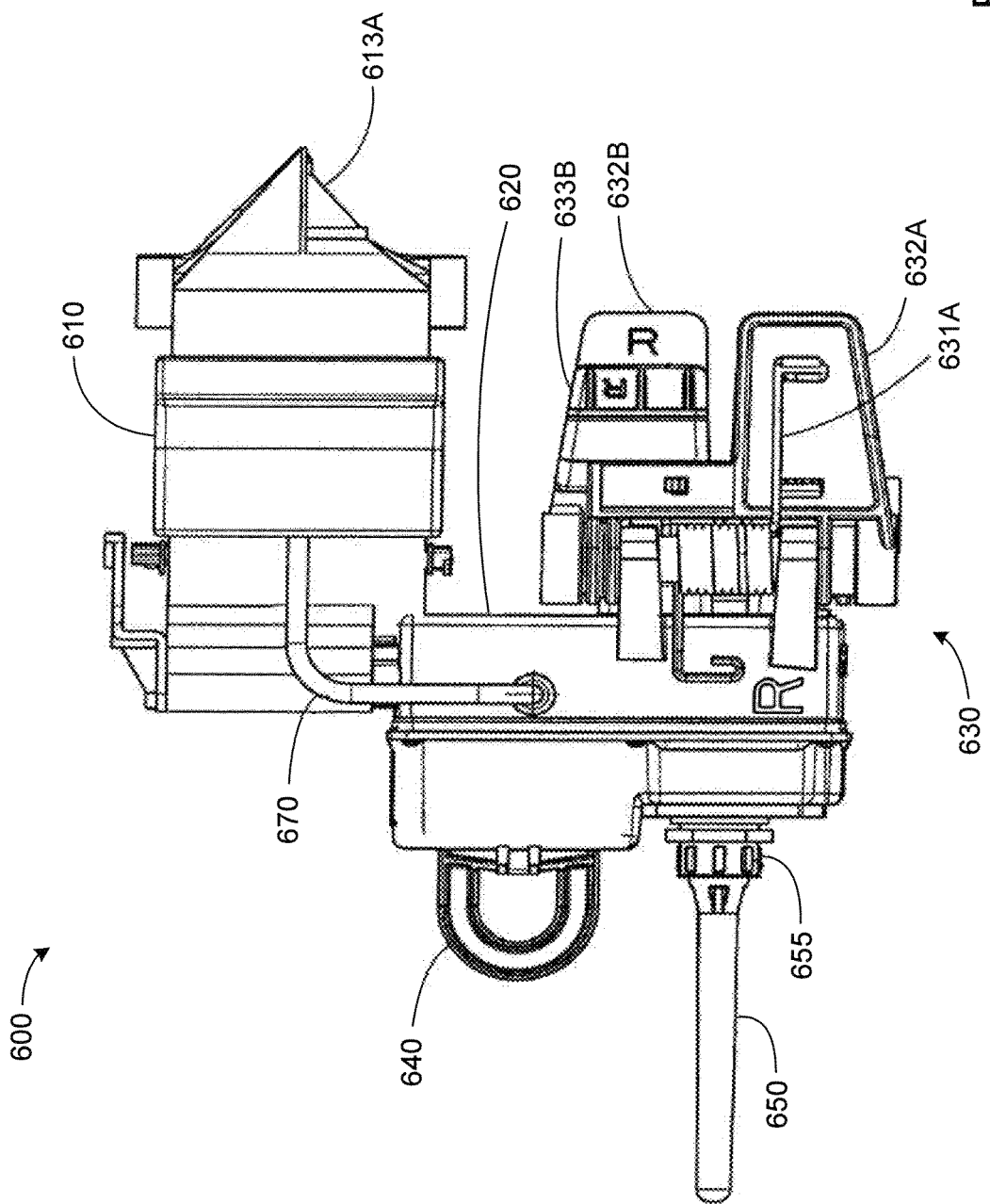
FIG. 6 is a side elevation view of a power line monitoring device, in accordance with certain exemplary embodiments.

FIG. 5 is a flow chart illustrating a method 330 for communicating data to individuals and/or an outage management system according to certain exemplary embodiments. FIG. 5 presumes that a fault or other information of interest has been detected and has been transmitted to a central server. The method 5330 will be described with reference to FIGS. 1 and 5.

In step 505 it is determined whether the server can contact the utility company's outage management system (OMS). If the server can contact the outage management system, the method 330 proceeds to step 510, wherein the server transmits the data to the OMS. The OMS can then display the data to operators on the utility company's existing systems. If the server cannot contact the utility company's OMS, the method 330 branches to step 515. The remote server also has capability to store all incoming information for historical purposes. This data historian can be used to analyze and improve the utility system performance.

In step 515, it is determined whether the server can contact individuals directly. If the server cannot contact individuals directly, the method 330 proceeds to step 520, wherein the server transmits the data to an individual via telephone call, text message, electronic mail message, or other similar form of communication. If, in step 515, it is determined that the server should not contact individuals, the method 330 branches to step 525.

In step 525, the server can generate an alternative presentation of the transmitted data for the utility company. In certain exemplary embodiments, the server generates a web page or other content that is suitable for Internet transmission that the utility company can visit through a standard Internet browser or other network communications mechanism. The web page will present the data transmitted by the monitoring device 100 in a graphical or textual form. This method also allows for the information to be presented via telephone calls, text messages, electronic mail, and other similar forms of communication. Once the alternative presentation is generated, the method 330 proceeds to step 530.

In step 530, the location of the transmitting monitoring devices 100 is determined. In certain exemplary embodiments, this information is determined from the data itself, which preferably contains geographic coordinates for the monitoring device 100 or the address where the monitoring device 100 is installed. Alternatively, the location of the monitoring device 100 can be determined by resolving a unique identifier for the monitoring device 100 that is transmitted with the data using a table or other database that includes associations between monitoring devices 100 unique identifiers and locations. After determining the location of the transmitting monitoring devices 100, the method 330 proceeds to step 535, wherein a line technician makes any necessary repairs.

Figure 7:
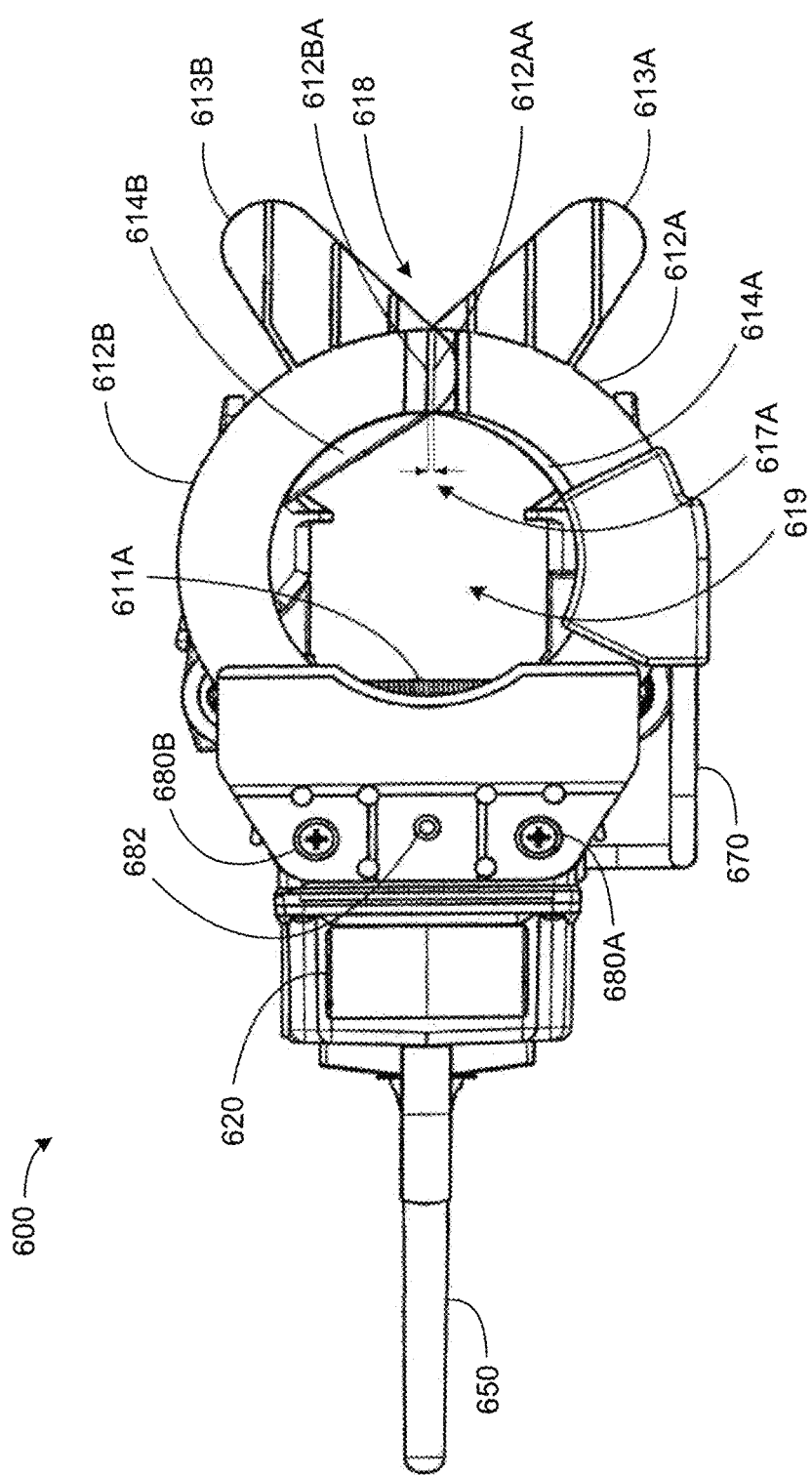
FIG. 7 is a top elevation view of the monitoring device of FIG. 6, in accordance with certain exemplary embodiments.
Figure 8:
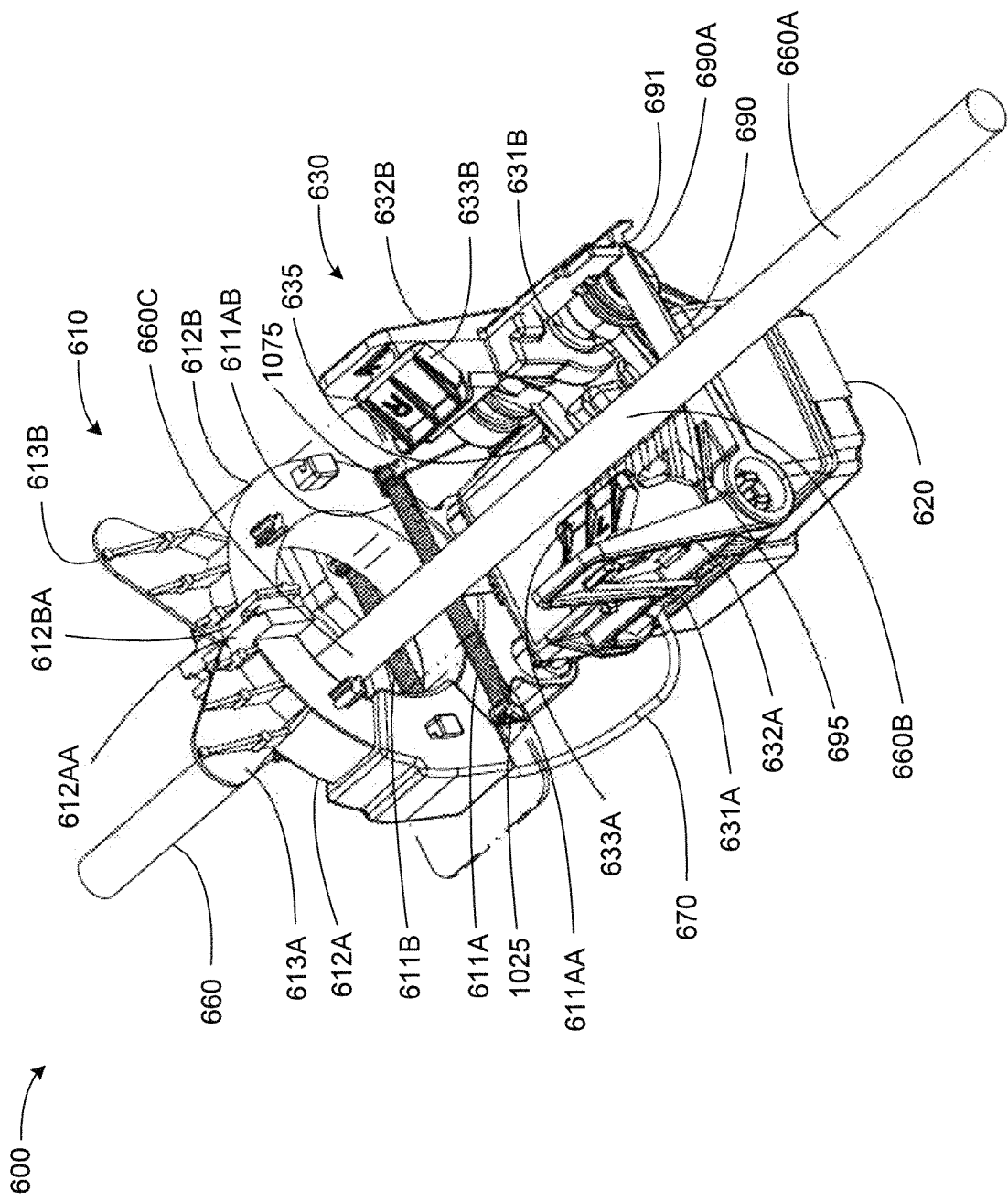
FIG. 8 is perspective side view of the monitoring device of FIG. 6, in accordance with certain exemplary embodiments.
Figure 9:
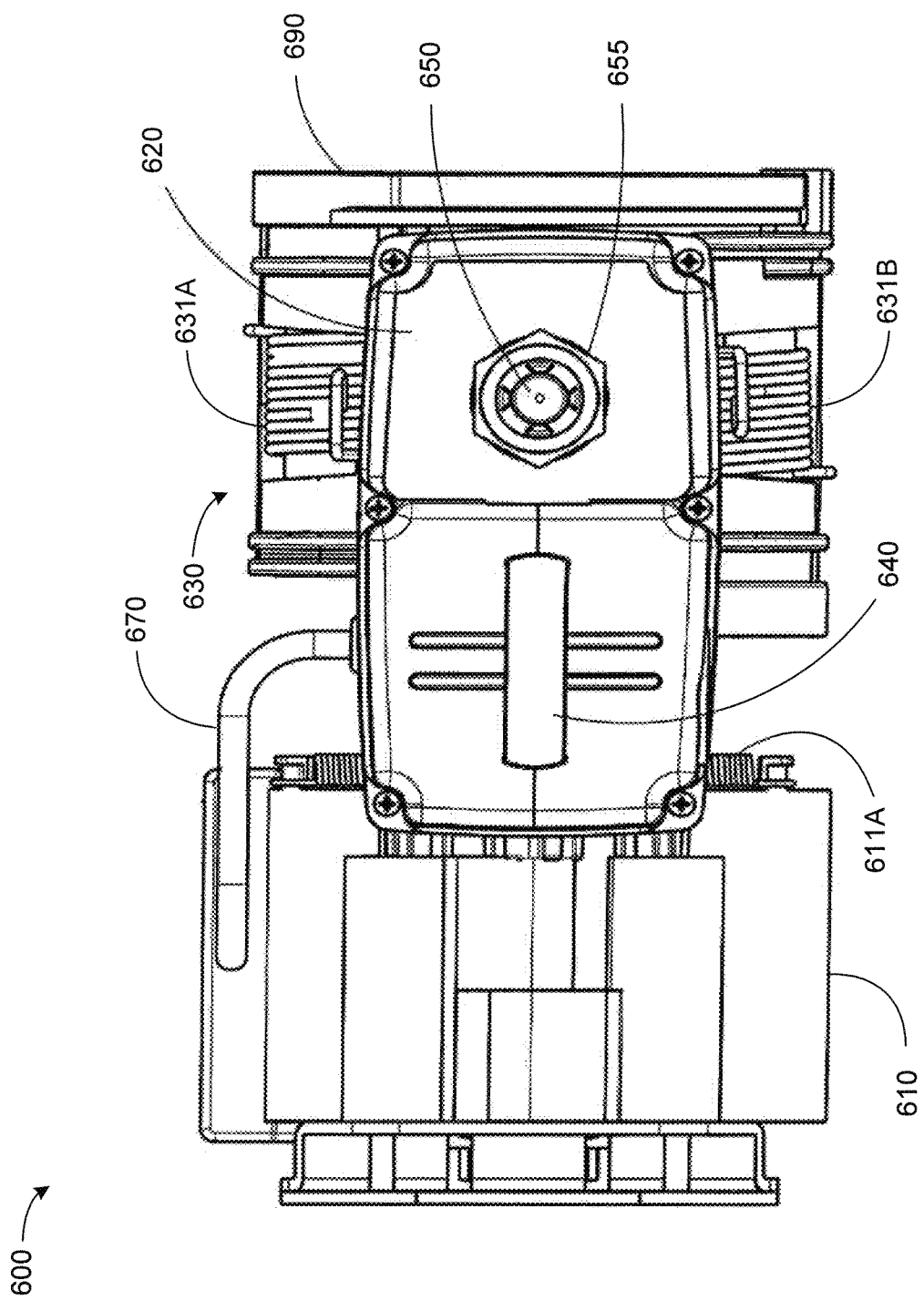
FIG. 9 is a rear elevation view of the monitoring device of FIG. 6, in accordance with certain exemplary embodiments.
Figure 10:
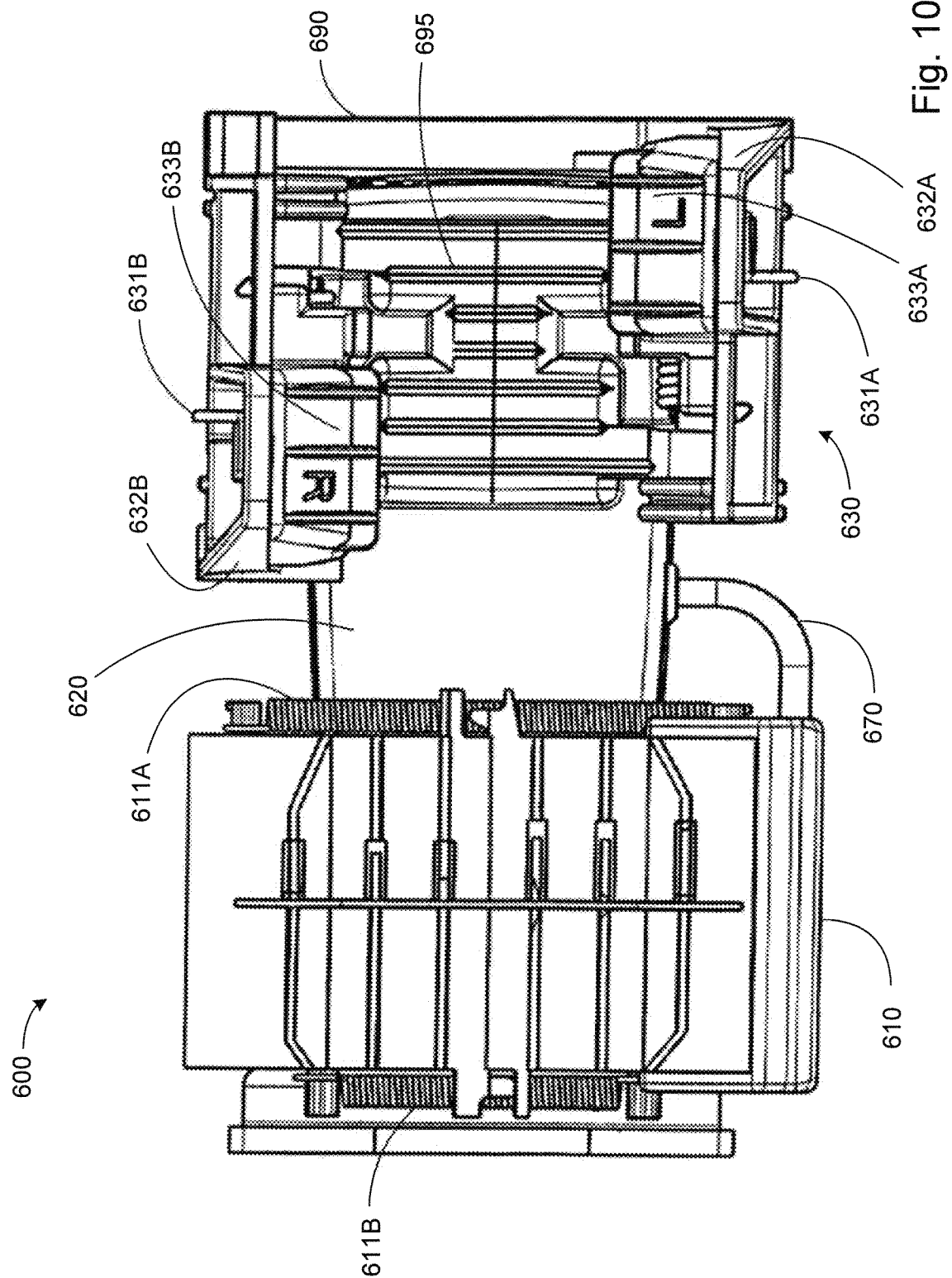
FIG. 10 is a front elevation view of the monitoring device of FIG. 6, in accordance with certain exemplary embodiments.

FIGS. 6-10 illustrate a power line monitoring device 600, in accordance with certain exemplary embodiments. With reference to FIGS. 6-10, the monitoring device 600 includes a CT 610 coupled to a housing 620. The CT 610 is configured to measure alternating current flowing through an electrical conductor 660 (FIG. 8). For example, the electrical conductor 660 can include a power or neutral line or other electrically conductive member to which the monitoring device 600 is coupled. As described below, the CT 610 is configured to harvest energy captured from a magnetic field generated by the current flowing through the conductor 660.

Figure 15:
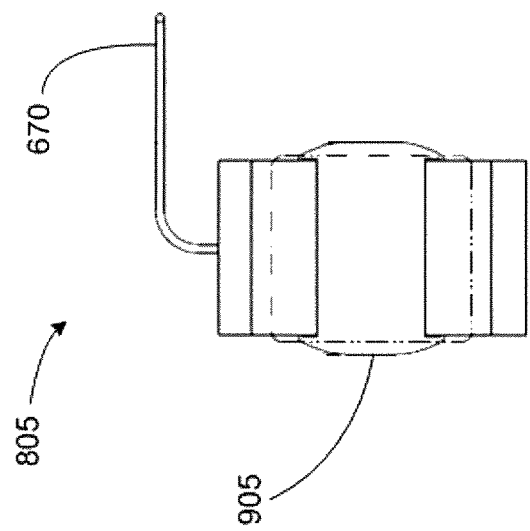
FIG. 15 is a side view of one of the split core sections illustrated in FIG. 14, in accordance with certain exemplary embodiments.
Figure 14:
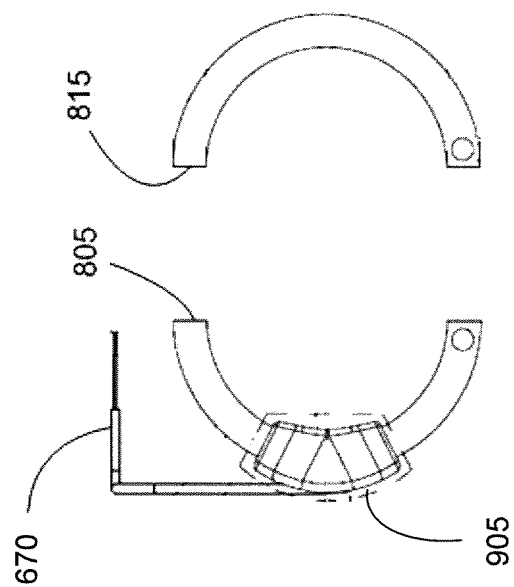
FIG. 14 is a front view of two split core sections of the monitoring device of FIG. 6, in accordance with certain exemplary embodiments.
Figure 16:
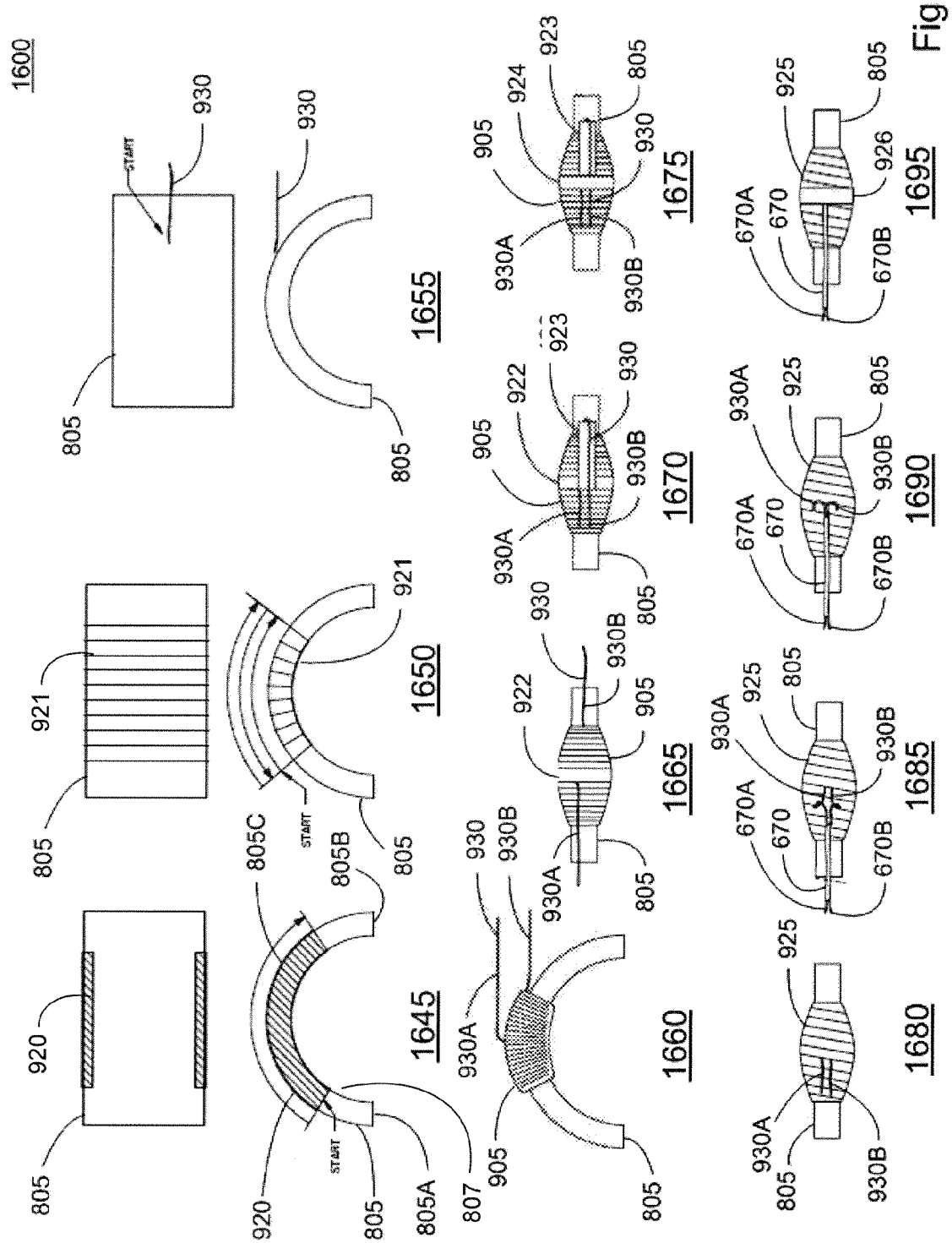
FIG. 16 depicts a method for forming a winding on a CT split core section, in accordance with certain exemplary embodiments.

As best seen in FIGS. 14-16, which are described below, the CT 610 includes a winding 905 wrapped around a portion of a magnetic core 805. Current flowing through the conductor 660 generates a magnetic field that extends around the conductor 660 and through the winding 905. This generated magnetic field induces a secondary current onto the winding 905 that is directly proportional to the current flowing through the electrical conductor 660 divided by a number of turns in the winding 905.

As would be recognized by a person of ordinary skill in the art having the benefit of the present disclosure, a CT typically includes both a primary winding and a secondary winding. In the exemplary embodiment depicted in FIGS. 6-10, the electrical conductor 660 and winding 905 act as the primary and secondary windings, respectively, of the CT 610, despite the fact that the electrical conductor 660 is a distinct component from the CT 610. Thus, the term "CT" is used herein to refer to an electrical device that measures current of, and harvests energy from, a conductor, which may be part of the CT or a separate component from the CT.

Figure 34:
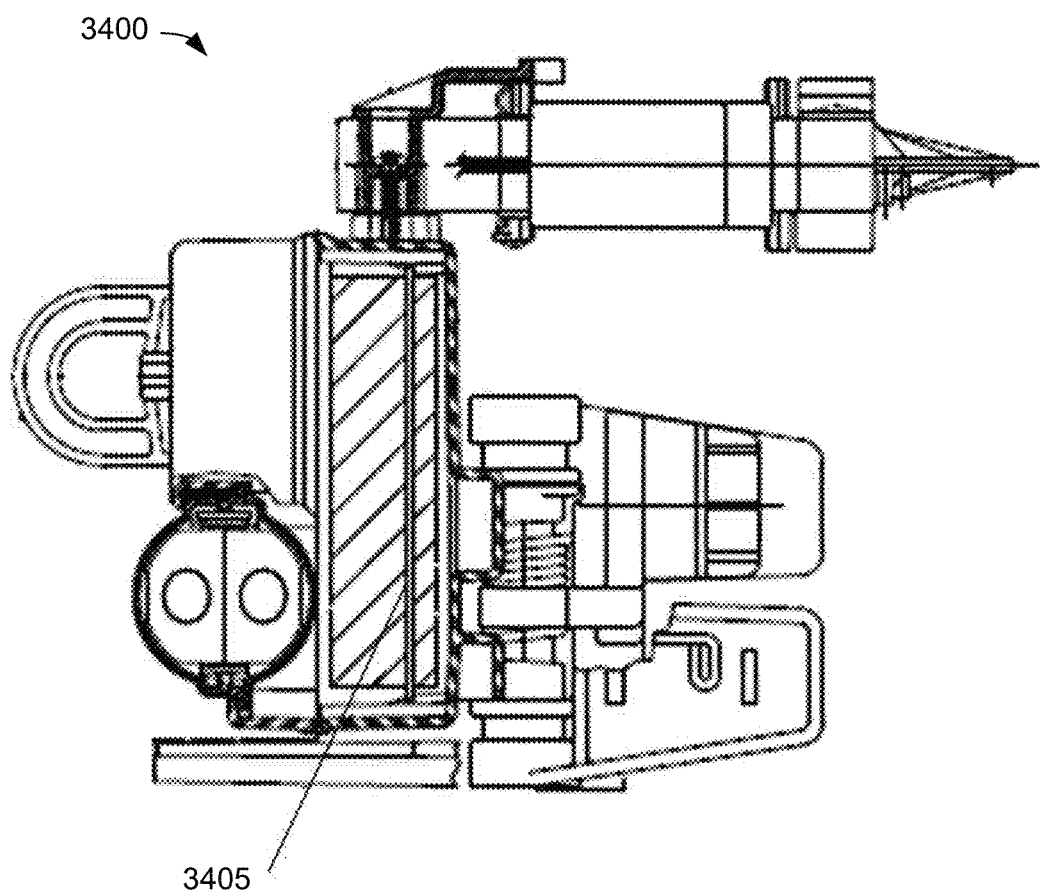
FIG. 34 is a side, partially cross-sectional view of a power line monitoring device, in accordance with certain alternative exemplary embodiments.
Figure 35:
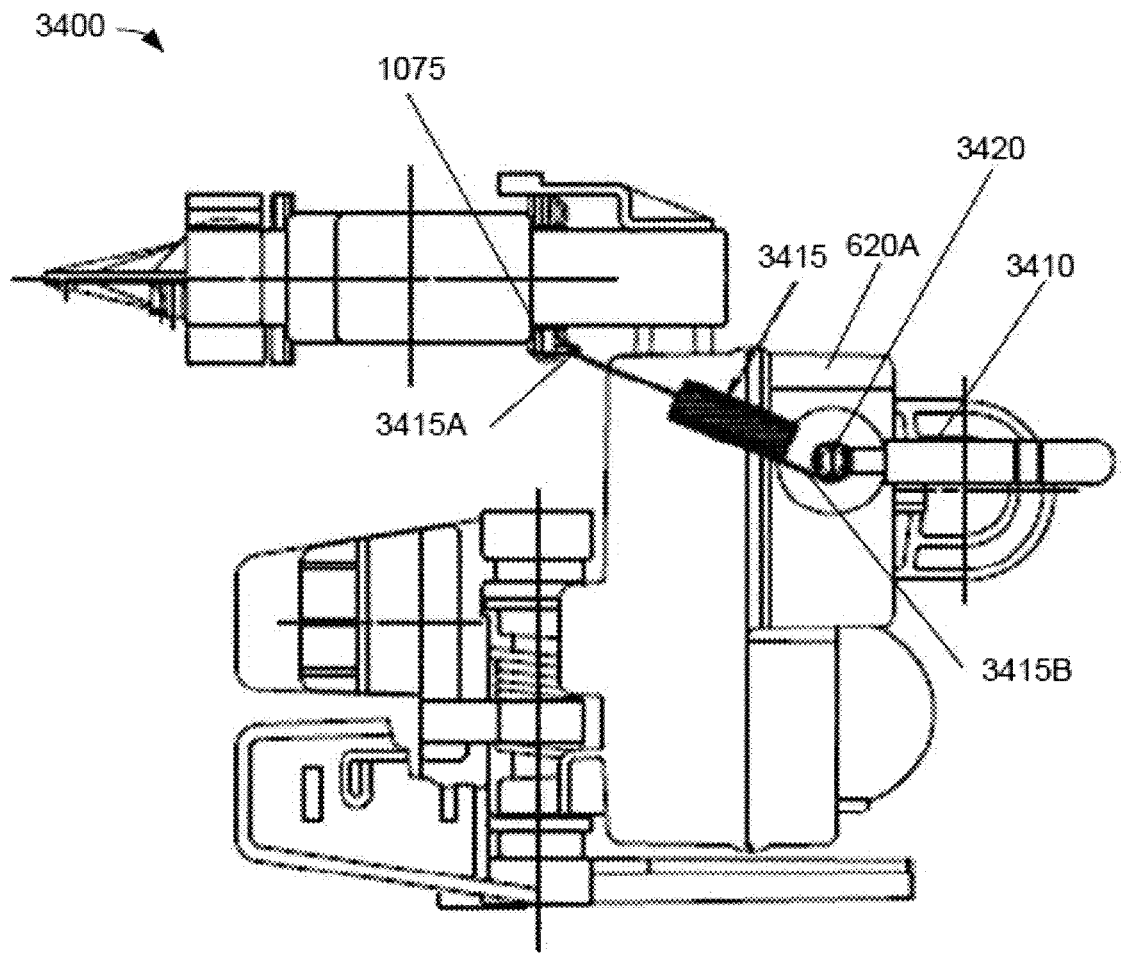
FIG. 35 is a side elevation view of the monitoring device of FIG. 34, in accordance with certain exemplary embodiments.
Figure 36:
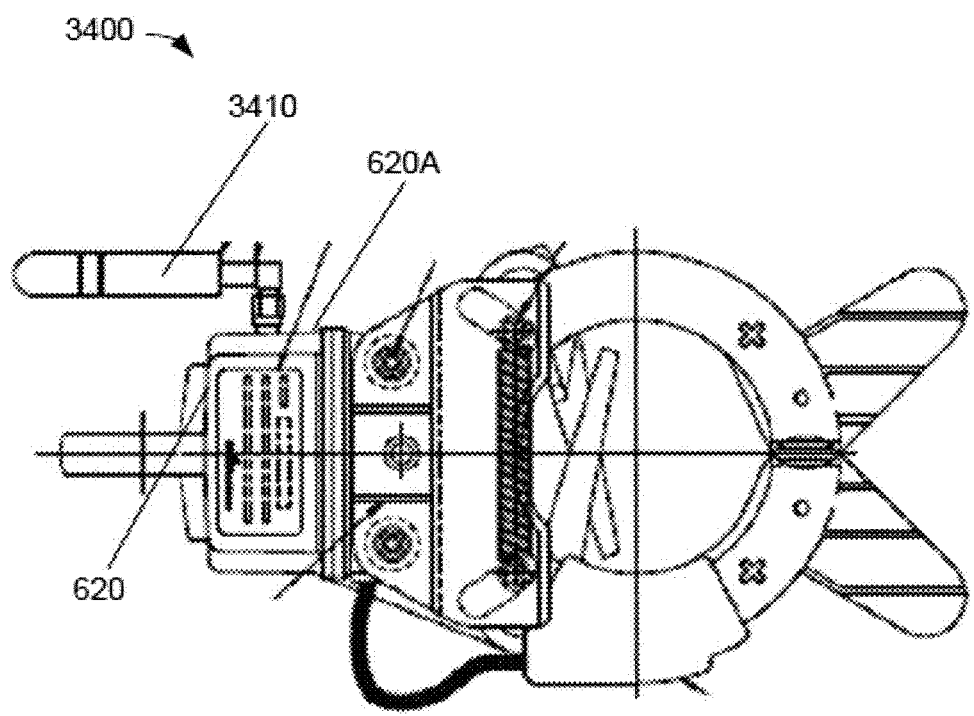
FIG. 36 is a top elevation view of the monitoring device of FIG. 34, in accordance with certain exemplary embodiments.

The monitoring device 600 includes circuitry 700 (FIG. 11) that converts the energy captured by the CT 610 into useful energy. The circuitry 700 also may include one or more sensors and/or communication devices, each of which may be similar to the sensor 102 and communications facility 110, respectively, described above with reference to FIGS. 1-5. Alternatively, such sensors and/or communication devices may be independent of the circuitry 700 but associated with, or incorporated in, the device 600. For example, such devices may be disposed within the housing 620. In certain exemplary embodiments, the circuitry 700 is mounted on a circuit board 3405 (FIG. 34) disposed within the housing 620. The circuitry 700 is described below with reference to FIG. 11.

The useful energy provided by the circuitry 700 can power one or more devices associated with the CT 610. For example, the device(s) can include one or more sensors (e.g., pressure, sound, level, moisture, temperature, etc., such as the sensor 102), cellular modems, satellite transceivers, indicating devices (e.g., lights), monitors, radios and/or other communication devices (such as the communications facility 110), and other devices that use electrical energy to operate. The device(s) can be located within the housing 620 or outside of the housing 620. For example, the device(s) can be located on or adjacent to the circuit board 3405. In embodiments in which the device(s) include a radio transmitter or other communications device, the monitoring device 600 can include an antenna 650 that enables communication between the device and another device located proximate the monitoring device 600 or remote from the monitoring device 600. The antenna 650 can be coupled to the housing 620 via an antenna connector 655 that maintains the physical integrity of the housing 620.

As described below, an electrical connector 670 can route the secondary current from the winding 905 to the circuitry 700. For example, the winding 905 of the CT 610 can be electrically coupled to the circuitry 700 via the electrical connector 670. The electrical connector 670 typically includes two insulated electrical lead wires 670A and 670B (FIG. 16). In certain exemplary embodiments, the electrical connector 670 can be disposed in a rigid structure, such as a conduit, that protects the electrical connector 670 from the environment. The CT 610 and the housing 620 can be adapted to receive the electrical connector 670 without compromising the integrity of the CT 610 or the housing 620.

In certain exemplary embodiments, a clamping mechanism 630 coupled to the housing 620 secures the monitoring device 600 to the electrical conductor 660. As described in more detail below, the clamping mechanism 630 secures the monitoring device 600 to the conductor 660 without compromising the integrity of the conductor 660 or the system in which the conductor 660 operates. That is, the clamping mechanism 630 secures the monitoring device 600 to the conductor 660 without disconnecting or removing power from the conductor 660. In certain exemplary embodiments, the clamping mechanism 630 operates in a manner substantially similar to that disclosed in U.S. Pat. No. 5,397,982, entitled "Releasable Sensor for Conductor Fault Detection Including a Rigid Trigger Arm," the complete disclosure of which is hereby fully incorporated herein by reference.

In certain exemplary embodiments, the housing 620 includes a pulling eye 640 that facilitates connection and disconnection of the monitoring device 600 from the conductor 660 using a "hotstick" (not shown). The pulling eye 640 includes a member that receives a grasping hook of the hotstick during connection or disconnection. Although illustrated in the figures as having a substantially "U" shape, a person of ordinary skill in the art having the benefit of the present disclosure will recognize that the pulling eye 640 can have any of a number of different shapes and configurations. The pulling eye 640 can be coupled to the housing 620 or integral to the housing 620.

The clamping mechanism 630 includes a body portion 635 and two clamp arms 632A and 632B. When the clamping mechanism 630 is in a closed position, the clamp arms 632A and 632B secure the conductor 660 against the body portion 635. Each clamp arm 632A and 632B includes a clamp spring 631A and 631B, respectively. The clamp springs 631A and 631B are biased to maintain the clamp arms 632A and 632B in the closed position until forcibly opened.

As best seen in FIG. 8, which illustrates the clamping mechanism 630 in an open position around the conductor 660, the clamping mechanism 630 also includes an actuator arm 690 attached to clamp arm 632A. The actuator arm 690 holds the clamp arms 632A and 632B open while securing the monitoring device 600 to the conductor 660. When the clamp arms 632A and 632B are rotated open, away from the body portion 635, a free side 690A of the actuator arm 690 is positioned in a receptacle 691 of clamp arm 632B. The receptacle 691 holds the actuator arm 690 in place, thereby preventing the clamp arms 632A and 632B from closing. The actuator arm 690 can be released from the receptacle 691 by applying a force to the actuator arm 690, in the direction of the body portion 635.

To secure the monitoring device 600 to the conductor 660, the monitoring device 600 can be pressed against the conductor 660, with the clamp arms 632A and 632B being disposed in the open position, and the actuator arm 690 being disposed in the receptacle 691. The force of the conductor 660 pressing against the actuator arm 690 releases the actuator arm 690 from the receptacle 691. The clamp springs 631A and 631B, in turn, act to close the clamp arms 632A and 632B around the conductor 660.

As discussed in more detail below with reference to FIGS. 27-32, the clamp arms 632A and 632B include clamp pads 633A and 633B, respectively. The clamp pads 633A and 633B include raised clamp slots 910 (FIG. 28) extending substantially perpendicularly to a longitudinal axis of the conductor 660. The clamp slots 910 help to minimize the motion of the conductor 660 relative to the clamp arms 632A and 632B by increasing a surface tension between the conductor 660 and the clamp aims 632A and 632B. In certain exemplary embodiments, the body portion 635 of the clamping mechanism 630 also includes raised slots 695 that help minimize the motion of the conductor 660.

As best seen in FIG. 7, the CT 610 includes two CT an is 612A and 612B that are adjacent to each other when the CT 610 is in the closed position. The CT arms 612A and 612B include magnetic core sections 805 and 815, respectively. The CT core sections 805 and 815 are described below in detail with reference to FIGS. 12-16. As best seen in FIG. 8, the CT arms 612A and 612B encircle the conductor 660 in operation so that the magnetic field generated by current flowing through the conductor 660 extends through the winding 905, which is disposed on the CT arm 612A. The magnetic field induces a current onto the winding 905 that is routed to the circuitry 700.

Each CT arm 612A, 612B includes a substantially elongated member from which an entry projection 613A, 613B, respectively, extends. The entry projections 613A and 613B are oriented in a manner that facilitates opening of the CT arms 612A and 612B when the entry projections 613A and 613B are acted on by a conductor 660. To secure the CT 610 to the conductor 660, the CT 610 is moved towards the conductor 660 to position the conductor 660 in a "V" area 618 defined by the entry projections 613A and 613B. When the conductor 660 presses against the entry projections 613A and 613B, in the V area 618, the entry projections 613A and 613B move apart from one another, thereby causing the CT arms 612A and 612B to open. Once the CT arms 612A and 612B are open, the conductor 660 can enter a CT cavity 619 disposed between the CT arms 612A and 612B. Once the conductor 660 passes inner surfaces of the CT arms 612A and 612B, the CT arms 612A and 612B close, encircling the conductor 660.

The CT arms 612A and 612B are spring biased to remain in the closed position when at rest. Specifically, each of the CT arms 612A and 612B is coupled to one or more springs, such as springs 611A and 611B, that maintain the CT arms 612A and 612B in the closed position when at rest. In certain exemplary embodiments, one or both of the springs 611A and 611B creates a conductive path between the conductor 660 and the circuitry in the housing 620 to ensure that the reference voltage for the circuitry is the same as that for the conductor 660. In such embodiments, both CT springs 611A and 611B contact the conductor 660 when the conductor 660 is positioned in the CT 610. Because the conductor 660 is in contact with the CT springs 611A and 611B, the conductor 660 makes contact with an electrical node in the circuitry which aids in the monitoring device 600 functions.

Adjacent to the entry projections 613A and 613B, the inner surface of each CT arm 612A, 612B includes an exit surface 614A, 614B. The exit surfaces 614A and 614B act in a manner similar to that of the entry projections 613A and 613B when removing the CT 610 from the conductor 660. When a force acts on the monitoring device 600 to remove the monitoring device 600 from the conductor 660, the exit surfaces 614A and 614B aid in overcoming the spring force on the CT arms 612A and 612B, thereby forcing the CT arms 612A and 612B into the open position. Once the CT arms 612A and 612B are in the open position, the CT 610 may be removed from the conductor 660. When the CT arms 612A and 612B are released from the conductor 660, such that the conductor 660 is no longer disposed between the CT arms 612A and 612B, the CT arms 612A and 612B can return to the closed position.

The CT arms 612A and 612B and the CT springs 611A and 611B are configured such that, when the CT 610 is in the closed position, an air gap 617A disposed between the end surfaces 612AA and 612BA of the CT arms 612A and 612B, respectively, at the entry point 618, is minimal in size. Similarly, an air gap disposed between end surfaces (not shown) of the CT arms 612A and 612B, opposite the entry point 618, may be minimal in size. In certain exemplary embodiments, each air gap may have a width of less than one thousandth of an inch, where the width of each air gap is measured from the CT 612A end surface adjacent one side of the air gap to the CT arm 612B end surface adjacent another side of the air gap. The minimal sizes of the air gaps allow the CT 610 to harvest more magnetic flux energy from the conductor as larger air gaps reduce the amount of available energy that can be harvested.

The monitoring device 600 may be installed on the electrical conductor 660 in any of a variety of different ways. In certain exemplary embodiments, the monitoring device 600 is installed by opening the clamping mechanism 630, holding the clamp arms 632A and 632B open with the actuator arm 690, and, when the actuator arm 690 makes contact with an outer surface 660A of a first segment 660B of the conductor 660, closing the clamping mechanism 630 to secure the monitoring device 600 to the conductor segment 660B. Once the monitoring device 600 is secured to the conductor segment 660B, the CT 610 may be installed on the conductor 660 by applying a force at the entry point 618 to open the CT arms 612A and 612B and thereby allow a second segment 660C of the conductor 660 to enter the CT cavity 619. As set forth above, once the conductor segment 660C enters the CT cavity 619, the CT arms 612A and 612B close, thereby encircling the conductor segment 660C.

Once the conductor segment 660C is disposed within the CT cavity 619 and the clamping mechanism 630 secures the conductor segment 660B, the CT 610 is able to convert energy contained in the magnetic flux generated by the conductor 660 into electrical power that is usable by other devices. Several issues arise when trying to develop usable energy from a CT 610 while at the same time not affecting the ability of the CT 610 to measure current.

In certain exemplary embodiments, the circuitry of the CT 610 is configured to harvest energy from a lightly loaded distribution power line and dissipate excess energy from a heavily loaded line. The circuitry includes a regulated power supply that takes advantage of an optimal power point of the CT 610 This optimal power point is based on the permeability of the core material, the cross sectional area of the core, the number of wire turns wrapped around the cross sectional area of the core, the air gap separating the core halves, the impedance of the input stage, the resonant frequency of the circuit, and other factors such as wire resistance, switching efficiencies, and other electrical factors. This optimum power point can be calculated or empirically determined.

The energy captured by the CT 610 may be stored with one or more capacitors (not shown) or other energy storage mechanisms. In certain exemplary embodiments, a regulator (not shown) keeps the charge on each capacitor from exceeding voltage levels that would damage the circuitry of the CT 610. This regulated voltage may be fed into a switching regulator (not shown) that regulates the voltage to the output voltage of another device (not shown), such as a sensor 102 and/or communications facility 110 (as discussed above in connection with FIGS. 1-5), that is being powered by the CT 610 and to charge a battery (not shown) or other energy storage device associated with the CT 610 to the regulated voltage. Circuitry may be used to control the switching regulator to work at the optimum operating voltage determined as set forth above. The energy captured by the CT 610 is available to be processed by the other device.

Figure 11A:
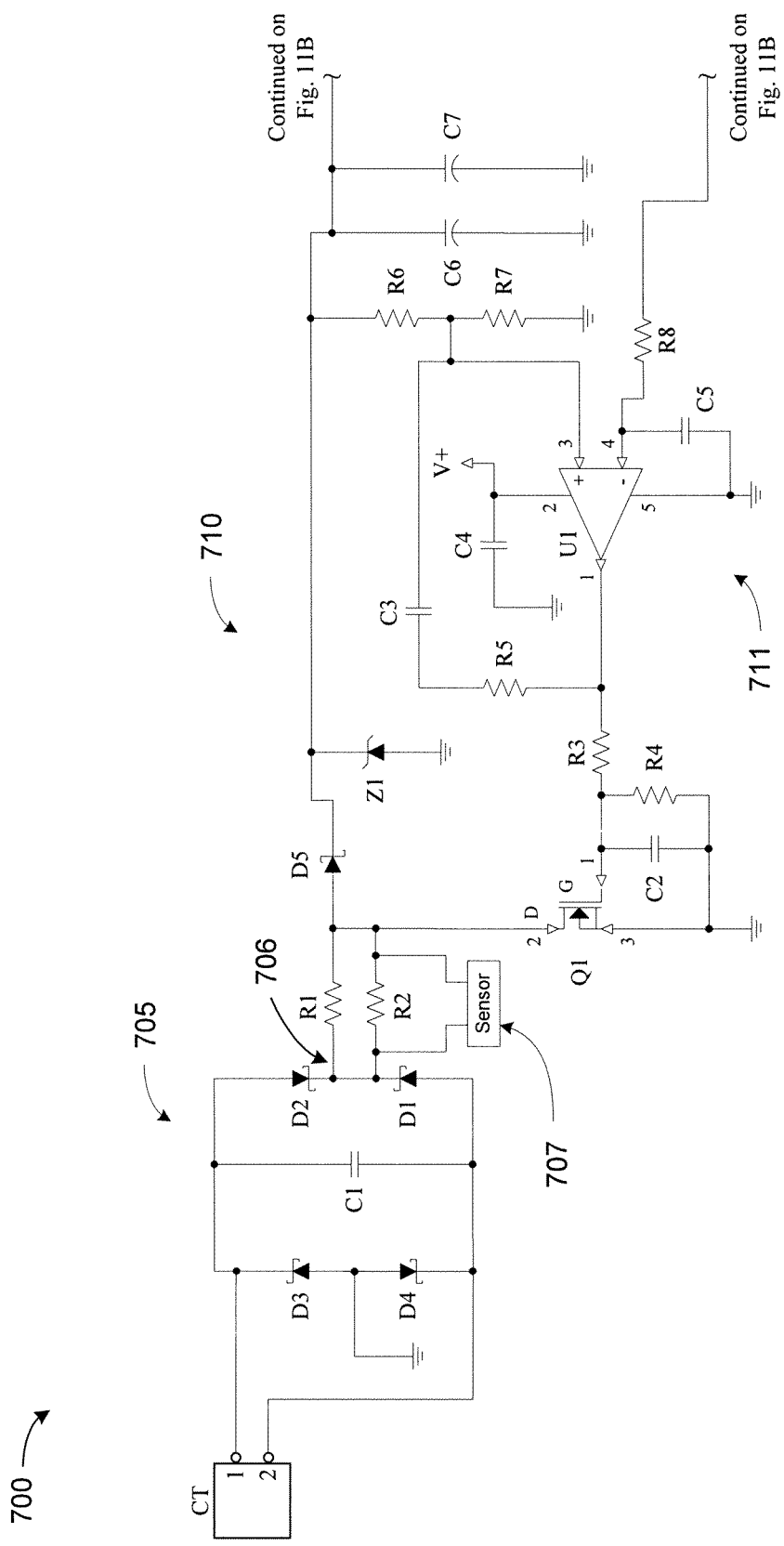
FIGS. 11A and 11B, is a circuit diagram for a circuit of the monitoring device of FIG. 6, in accordance with certain exemplary embodiments.
Figure 11B:
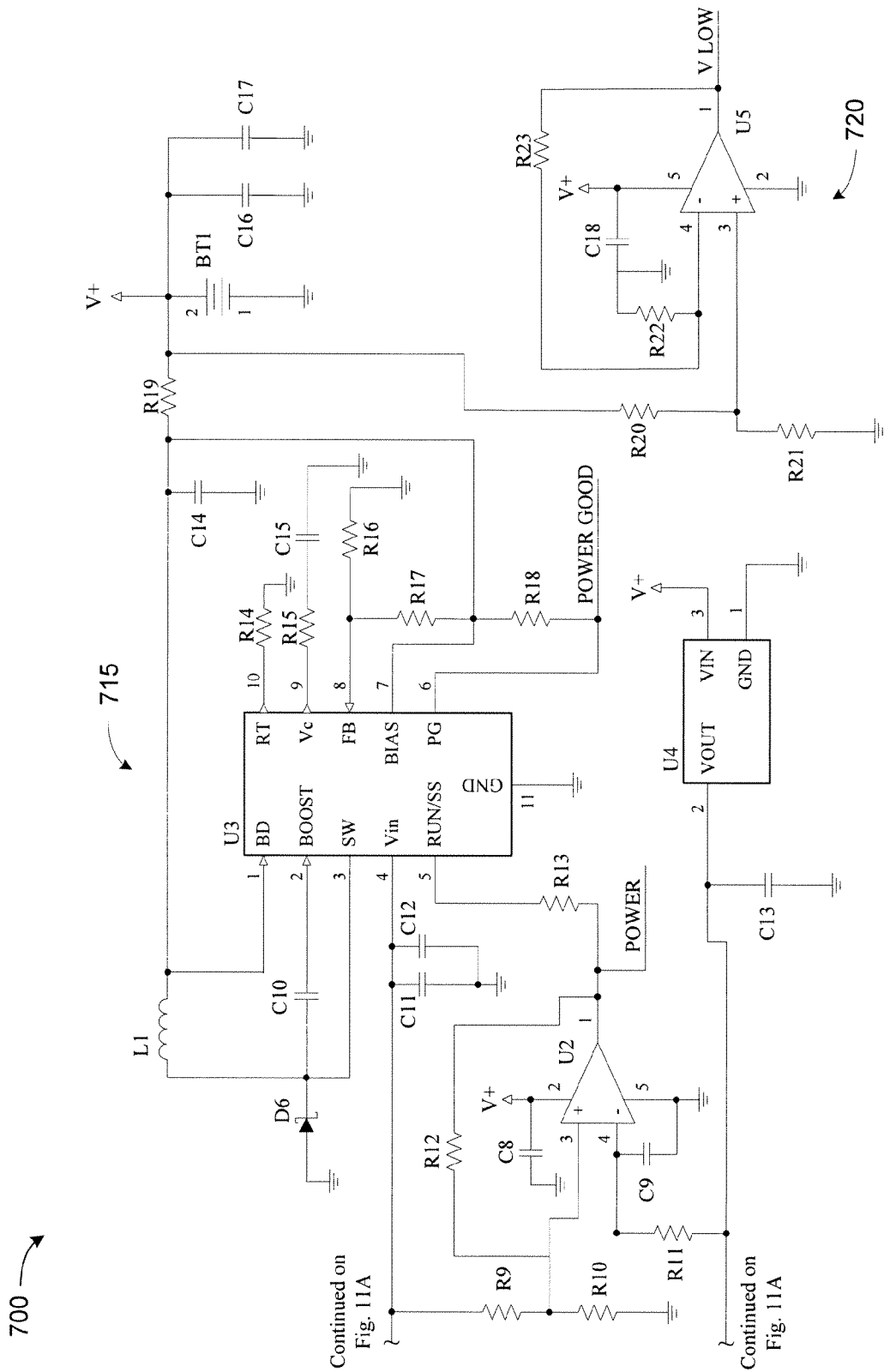

FIG. 11, which includes FIGS. 11A and 11B, depicts a circuit 700 utilized by the monitoring device 600 to process the captured energy, in accordance with certain exemplary embodiments. The circuit 700 is described herein with reference to FIGS. 6-11. As discussed above, magnetic flux energy scavenged by the CT 610 is routed by way of the electrical connector 670 to a circuit board in the housing 620. In certain exemplary embodiments, the circuit board can include the circuit 700 and any other circuitry associated with the monitoring device 600.

In certain exemplary embodiments, the circuit 700 includes means for regulating current and voltage. This regulating functionality addresses variations in the energy scavenged by the CT 610. For example, such variations can include moment-by-moment differences in the current flow through the conductor 660.

One means for regulating current and voltage includes a pre-regulator circuit 710. The pre-regulator circuit 710 includes an n channel field effect transistor ("FET") Q1, a voltage comparator U1, and associated resistors R1-R13 and capacitors C2-C13. The pre-regulator circuit 710 is designed to take the output of the CT 610 and develop a voltage that is matched to a power curve of the CT 610. This task is accomplished by connecting the output of the CT 610 to a full wave bridge rectifier circuit 705 to create a DC current from the AC current output from the CT 610. The full wave bridge rectifier circuit 705 includes four diodes D1-D4 and a capacitor C1. The capacitor C1 is tuned with the CT 610 to provide voltage amplification for the DC output from the full wave bridge rectifier circuit 705.

The output of the full wave bridge rectifier circuit 705 is connected to the FET Q1 and a diode D5 and charges holding capacitors C6 and C7. Typically, the holding capacitors C6 and C7 are several 100 micro-farads in size. As the capacitors C6 and C7 charge, a comparator circuit 711 including the voltage comparator U1 monitors the voltage. At a pre-described voltage level, the FET Q1 is turned on to shunt excess energy through the FET Q1. The diode D5 blocks the capacitors C6 and C7 from discharging. Therefore, the only current through the FET Q1 is from the CT 610. Since this is a very low impedance path, very little heat is generated. As the voltage drops across the holding capacitors C6 and C7, the FET Q1 turns off, allowing the capacitors C6 and C7 to charge. This process continues as long as the power input from the CT 610 is more than the power requirements of the load (radio or other active device) and charging of the battery BT1. Any unneeded power is dissipated to ground.

In certain exemplary embodiments, the circuit 700 includes a current sensor circuit 707, which calculates current in the conductor 660 based on the fact that the current is directly proportional to the current on the primary winding of the CT 610 divided by the number of secondary windings of the CT 610. A burden resistor (combination of R1 and R2) is placed on the negative tap 706 of the full wave bridge rectifier circuit 705 to produce a voltage proportional to the value of the burden resistor based on the amount of current flowing through the burden resistor. The resistance of the burden resistor is typically small. For example, in certain exemplary embodiments, the resistance can be approximately 0.25 ohms. The burden resistor creates a negative signal that can be amplified to desired levels. The accuracy of the current measurement depends on the CT's ability to remain linear while developing the circuit voltage required. This largely depends on the permeability and area of the core and turns ratio of the CT 610.

The circuit 700 also includes a switching regulator circuit 715. In certain exemplary embodiments, the switching regulator circuit 715 includes a buck regulator topology including a buck regulator U3 and associated resistors R14-R18 and capacitors C10 and C14-C15. Tests have shown that, by regulating the voltage input to the switching regulator circuit 715 to be slightly above an exemplary CT's 610 optimal voltage of approximately 23 volts, a 6× current gain is achieved when regulating down to 3.3 volts. The 6× current gain reduces the need to supply large currents from the CT 610 at low line power which in turn reduces the stress on the FET Q1 when dissipating excess current at high line loads. As a theoretical example, consider a CT 610 with a 10 amp primary current and 500 secondary turns, which would result in 10/500=0.02 amps root mean square (RMS). To get the DC current, one can multiply the current by 0.707: 0.02*0.707=0.014 amps DC. Multiplying this current by the current gain of 6 yields 0.084 milliamps at 3.3 volts, or approximately 0.25 watts of power. The actual current may deviate from the calculated current. For example, switch inefficiency can result in a lower actual available DC current.

Feeding the output of the switching regulator circuit 715 to a battery BT1 allows for an easy way to float charge the battery. This is achieved by isolating the battery BT1 from the output of the switching regulator circuit 715 by a small resistance R19. This allows the battery BT1 to charge when the load is drawing less power than the CT 610 is harvesting. While the device being powered by the monitoring device 600 is active (e.g., transmitting mode for a radio), the battery BT1 can supply any excess current required by the device. As long as the total power into the battery BT1 from the CT 610 is greater than the total power out of the battery BT1 to the device, the battery BT1 will stay in a charged state. For example, the battery BT1 can have an optimum working voltage of 3.3 volts and an acceptable working voltage range of 3.2 to 3.4 volts.

In certain exemplary embodiments, the circuit 700 includes a battery voltage monitor circuit 720 that monitors the voltage of the battery BT1. If the battery voltage monitor circuit 720 senses that the voltage of the battery BT1 is below a threshold value, the battery monitor circuit 720 sends a signal, such as a "V LOW" signal, to a controller circuit (not shown) that is operable to shut off power to the device. In certain exemplary embodiments, the controller circuit can include a microcontroller having configurable instructions for powering the device down immediately or via a controlled shutdown. Once a suitable voltage is sensed on the battery BT1, the controller circuit can provide a signal, such as a "POWER" signal, to the buck regulator U3 to re-energize the device.

To allow the circuit to start up, the voltage comparator U1 monitors the voltage on the pre-regulator 710. When the voltage is below a defined voltage limit, which may be based on the optimum voltage of the CT 610, the voltage comparator U1 holds the switching regulator circuit 715 in the off state. When the voltage rises above a defined threshold value, which may be based on the optimum voltage of the CT 610, the voltage comparator U1 enables the buck regulator U3, thereby allowing the circuit 700 to supply a regulated voltage to the load and to charge the battery BT1. If the voltage drops below a certain voltage, the voltage comparator U1 can shut off the switching regulator circuit 715, thereby allowing the voltage to rise. As the voltage rises, the voltage comparator U1 can turn the switching regulator circuit 715 back on. This circuit 700, in combination with the configuration of the 610, allows the system to operate at minimum line power. In certain exemplary embodiments, the circuitry 700 may provide for shut down powering of one or more components. Shut down powering involves systematically powering down a device to prevent damage in the event of a loss of electrical power.

Representative values for the components of the circuit 700 are listed below in Tables 1 and 2. A person of ordinary skill in the art having the benefit of the present disclosure will recognize that these values are merely exemplary, and other values may be chosen without departing from the spirit and scope of the invention.

TABLE 1

Exemplary Resistor Values for the Circuit 700

| Circuit Component | Value |
| --- | --- |
| R1 | 0.05 Ω |
| R2 | 0.05 Ω |
| R3 | 1 kΩ |
| R4 | 1 MΩ |
| R5 | 2 MΩ |
| R6 | 2 MΩ |
| R7 | 105 kΩ |
| R8 | 10 kΩ |
| R9 | 2 MΩ |
| R10 | 113 kΩ |
| R11 | 10 kΩ |
| R12 | 4.99 MΩ |
| R13 | 1 kΩ |
| R14 | 60.4 kΩ |
| R15 | 19.1 kΩ |
| R16 | 604 kΩ |
| R17 | 1 MΩ |
| R18 | 100 kΩ |
| R19 | 0.05 Ω |
| R20 | 2 MΩ |
| R21 | 787 kΩ |
| R22 | 1 MΩ |

TABLE 2

Exemplary Capacitor Values for the Circuit 700

| Circuit Component | Value |
| --- | --- |
| C1 | 1 μF |
| C2 | 0.01 μF |
| C3 | 33 pF |
| C4 | 0.1 μF |
| C5 | 0.1 μF |
| C6 | 220 μF |
| C7 | 220 μF |
| C8 | 0.1 μF |
| C9 | 0.1 μF |
| C10 | 0.1 μF |
| C11 | 22 μF |
| C12 | 0.1 μF |
| C13 | 1 μF |
| C14 | 22 μF |
| C15 | 680 pF |
| C16 | 47 μF |
| C17 | 0.1 μF |
| C18 | 0.1 μF |

Figure 13:
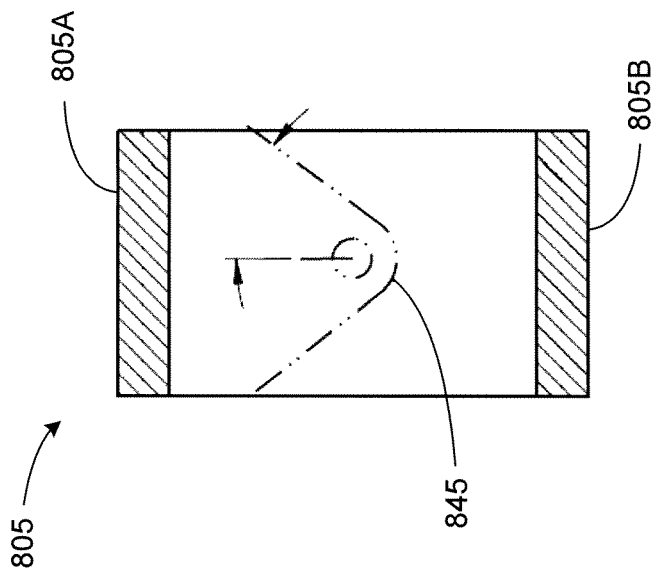
FIG. 13 is a side view of one of the split core sections illustrated in FIG. 12, in accordance with certain exemplary embodiments.
Figure 12:
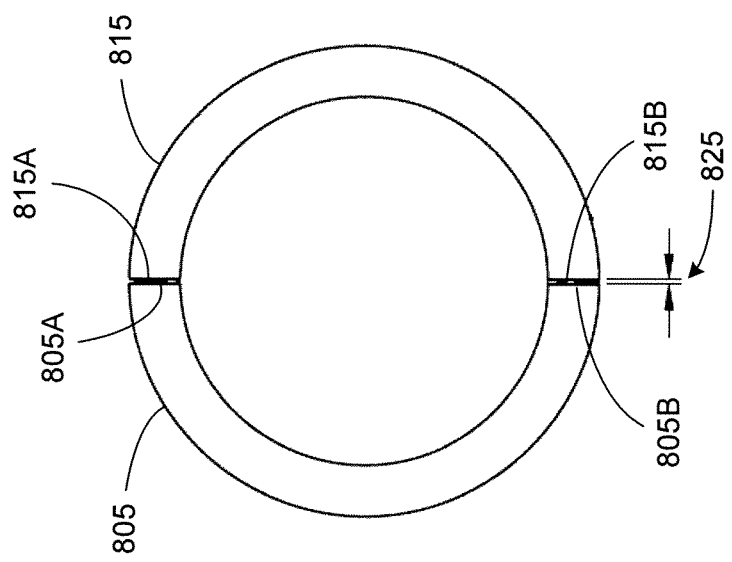
FIG. 12 is a front view of two split core sections of a current transformer ("CT") of the monitoring device of FIG. 6, in accordance with certain exemplary embodiments.

FIG. 12 is a front view of two split core sections 805 and 815 of the CT 610, in accordance with certain exemplary embodiments. FIG. 13 is a side view of the split core section 805, in accordance with certain exemplary embodiments. With reference to FIGS. 12-13, each split core section 805, 815 is disposed within a corresponding one of the CT arms 612A and 612B.

In certain exemplary embodiments, the split core sections 805, 815 are formed by winding layers of metal around a magnetic form, such as a mandrel, to form a core, and then splitting the core into two sections 805 and 815. The core may be formed from any of a variety of different materials, such as grain oriented silicon steel, supermalloy, permalloy, ferrites, and/or other materials. In certain exemplary embodiments, the core is coated with an epoxy to ensure that a winding 905 disposed on one of the split core sections 805 or 815 does not short out to the split core section 805 or 815. The core may be coated either before or after being split into the sections 805 and 815. In certain exemplary embodiments, the core may be vacuum-impregnated with a varnish to hold laminations of the core together and protect the core from moisture. In certain exemplary embodiments, the thickness of the laminations is configured for 60 Hz operation.

In certain exemplary embodiments, some or all of each split core section 805, 815 is covered in an insulating material. The insulating material can prevent direct contact between the conductive material in each split core section 805, 815 and the conductor 660. The insulating material also can protect the split core sections 805 and 815 from the environment. In addition, or in the alternative, the surfaces of the split core sections 805 and 815 may be covered with a thin coating to protect them from possible corrosive elements in the environment. For example, the coating can between 0.2 mil and 0.6 mil thick.

In certain exemplary embodiments, end surfaces 805A and 805B and 815A and 815B of the split core half sections 805 and 815, respectively, are substantially flat and coplanar. In certain exemplary embodiments, the split core sections 805 and 815 and any coating and/or insulation thereon are sized and configured such that there is only a short distance 825 between adjacent pairs of the end surfaces 805A-805B and 815A-815B. In certain exemplary embodiments, a lap taping described below with reference to FIG. 16 starts and ends at location 845 on a surface of the split core section 805.

FIGS. 14-15 depict the split core sections 805 and 815, in accordance with certain exemplary embodiments. Referring to FIGS. 14-16, the split core section 805 includes a winding 905 of an electrical wire 930 (FIG. 16) that is disposed around a member 807 of the split core section 805. In certain exemplary embodiments, the winding 905 is located approximately in the center of the split core section 805, extending approximately 28 degrees toward each end surface 805A and 805B of the split core section 805. The winding 905 is electrically coupled to the conductors 670A and 670B of the electrical connector 670 as described in more detail with reference to FIG. 16.

FIG. 16 depicts a method 1600 for forming the winding 905 on the member 807 of the CT split core section 805, in accordance with certain exemplary embodiments. In step 1645, a tape 920, such as a fiberglass tape, is wrapped around a middle segment 805C of the CT split core section 805. In the exemplary embodiment depicted in FIG. 16, the tape 920 starts and ends at approximately 35 degrees from the end surfaces 805A and 805B of the split core section 805. The tape 920 completely overlaps the outer diameter of the split core section 805 and partially overlaps each side of the inner diameter of the split core section 805.

In step 1650, another tape 921, such as a Kapton® brand tape, is applied to a middle portion of the middle segment 805C with one-half lap taping. In the exemplary embodiment depicted in FIG. 16, the tape 921 starts and ends at approximately 50 degrees from the end surfaces 805A and 805B of the split core section 805. In certain exemplary embodiments, three layers of the tape 921 are applied to the split core section 805 with one-half lap taping, reversing the direction of the tape 921 for each layer.

In step 1655, a wire 930 is placed on the split core section 805. In step 1660, the wire 930 is wrapped around the split core section 805 multiple times to form the winding 905. For example, the wire 930 may be wrapped around the split core section 805 five hundred times to form the winding 905.

In step 1665, a tape 922 is placed over a first end 930A of the wire 930 to hold the first end 930A in place. In step 1670, another tape 923 is applied over the winding 905, from the tape 922 to an end of the split core section 805, and a second end 930B of the wire 930 is bent back to be substantially parallel and adjacent to the first end of the wire 930A. In step 1675, another tape 924 is placed over the first and second ends 930A and 930B and the tape 922.

In step 1680, another tape 925 is wrapped around the winding layers 905, leaving the first and second ends 930A and 930B exposed. In step 1685, the first and second ends 930A and 930B are connected to the electrical lead wires 670A and 670B respectively, thereby electrically coupling the electrical lead wires 670A and 670B to the winding 905. In certain exemplary embodiments, the first end 930A is twisted and soldered with the lead wire 670A and the second end 930B is twisted and soldered with the lead wire 670B.

In step 1690, the electrical lead wires 670A and 670B are bent in the direction of the electrical connector 670 and pressed against the tape 925. In step 1695, the electrical lead wires 670A and 670B are secured in place with a tape 926. In certain exemplary embodiments, a dielectric tape suitable for high temperature applications is used for each of tapes 922-926. In certain exemplary embodiments, the split core section 805, including the winding 905, is then covered with an insulating material and overmolded in plastic.

FIG. 17 is a top elevation view of the CT arm 612A of the split core section 805, in accordance with certain exemplary embodiments. FIG. 18 is a side cross sectional view of the CT arm 612A, in accordance with certain exemplary embodiments. FIG. 19 is a top elevation view of the CT arm 612B of the split core section 815, in accordance with certain exemplary embodiments. FIG. 20 is a side cross sectional view of the CT arm 612B, in accordance with certain exemplary embodiments.

With reference to FIGS. 7 and 17-20, the proximal end 612AB of the CT arm 612A includes two apertures 1005 and 1015. Similarly, the proximal end 612BB of the CT arm 612B includes two apertures 1055 and 1065. When the CT arms 612A and 612B are coupled to the housing 620, the apertures 1005 and 1055 substantially overlap with one another and are aligned with a connector 682. The apertures 1005 and 1055 are sized and shaped to receive the connector 682, which extends through the apertures 1005 and 1055, thereby coupling the CT arms 612A and 612B to the housing 620. When the CT aims 612A and 612B open and close, the CT arms 612A and 612B pivot around at least a portion of the connector 682, which defines an axis of movement for the CT arms 612A and 612B.

Each of the second apertures 1015 and 1065 is sized and configured to receive a corresponding connector 680A and 680B. When the CT arms 612A and 612B are coupled to the housing 620, each connector 680A and 680B extends through its respective aperture 1015, 1065. The connectors 680A and 680B prevent the CT arms 612A and 612B from moving more than a predetermined distance apart from one another.

Each CT arm 612A, 612B includes a spring connection 1025, 1075, respectively, which protrudes from a main body portion 612AC, 612BC, respectively, of the CT arm 612A, 612B. These spring connections 1025 and 1075 are sized and configured to attach the CT spring 611A to the CT arms 612A and 612B. For example, as illustrated in FIG. 8, a first end 611AA of the CT spring 611A can be coupled to the spring connection 1025, and a second end 611AB of the CT spring 611A can be coupled to the spring connection 1075. Although not readily visible in the figures, similar spring connections are disposed on the CT arms 612A and 612B, opposite the spring connections 1025 and 1075, for attaching the CT spring 611B to the CT arms 612A and 612B.

As set forth above, the CT arms 612A and 612B remain in a closed position unless acted on by an outside force. The springs 611A and 611B enable this functionality. The springs 611A and 611B are biased to apply forces to the CT arms 612A and 612B, in the direction of the closed position. As set forth above, when the conductor 660 enters the CT 610, the conductor 660 overcomes those forces, thereby causing the CT arms 612A and 612B to open.

As shown in FIGS. 18 and 20, in certain exemplary embodiments, the split core sections 805 and 815 and CT arms 612A and 612B have different cross sectional areas. In part, this difference in cross-sectional area may be based on the fact that only the split core section 805—and not the split core section 815—includes winding 905. Thus, the CT 610 includes only one winding 905. In certain alternative exemplary embodiments, both the split core section 805 and 815 include a winding 905.

FIGS. 21-24 illustrate the housing 620 of the monitoring device 600, in accordance with certain exemplary embodiments. With reference to FIGS. 21-24, as set forth above, the housing 620 includes a member that defines an internal cavity in which various components of the monitoring device 600 are disposed. For example, the housing 620 may enclose the circuitry of the CT 610. In addition, the housing may enclose one or more devices that are powered by the circuitry of the CT 610. A person of ordinary skill in the art having the benefit of the present disclosure will recognize that the housing 620 can vary in size and shape. For example, the size and shape of the housing 620 can depend on the sizes and shapes of the components to be accommodated therein. The housing 620 can also be constructed from any suitable material that can withstand exposure to environmental conditions. The housing 620 can also be enclosed via a molding process.

As best seen in FIG. 24, in certain exemplary embodiments, the housing 620 includes a space 621 in which an additional device, such as an energy storage device (not shown), may be installed. The energy storage device can power one or more devices enclosed in the housing 620 and normally powered by the circuitry of the CT 610 when the conductor 660 is de-energized or when the conductor 660 is not providing a sufficient amount of energy. For example, the energy storage device can include a battery, a rechargeable battery (such as the battery BT1 depicted in FIG. 11), a supercapacitor, or another energy storage device.

When the monitoring device 600 includes an antenna 650, the housing 620 can include an aperture 1110 through which at least a portion of the antenna 650 can extend. As discussed above, the antenna 650 may be present when the device powered by the monitoring device 600 is a communications device, such as a radio or a repeater. In addition to, or in place of the antenna 650, the aperture 1110 may receive one or more other components. For example an indicator that provides an indication of the status of the monitoring device 600 or a status of a device powered by the monitoring device 600 can be at least partially disposed within the aperture 1110. Although depicted in the figures as being substantially round with one flat side, a person of ordinary skill in the art having the benefit of the present disclosure will recognize that the aperture 1110 can have any of a number of different sizes and shapes depending on the application of the monitoring device 600.

Figure 26:
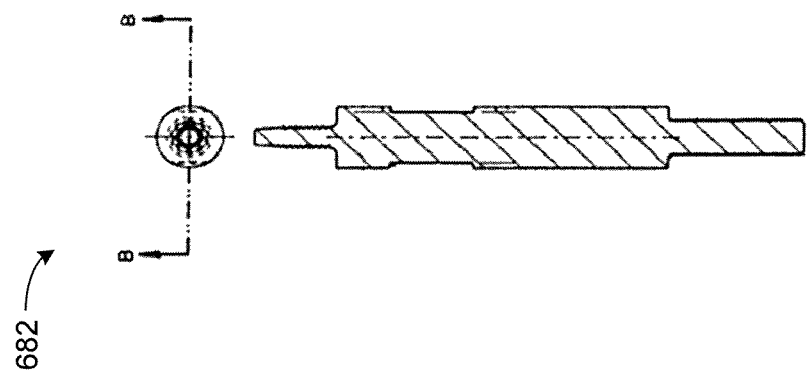
FIG. 26 is a cross-section of a male connector, in accordance with certain exemplary embodiments.
Figure 25:
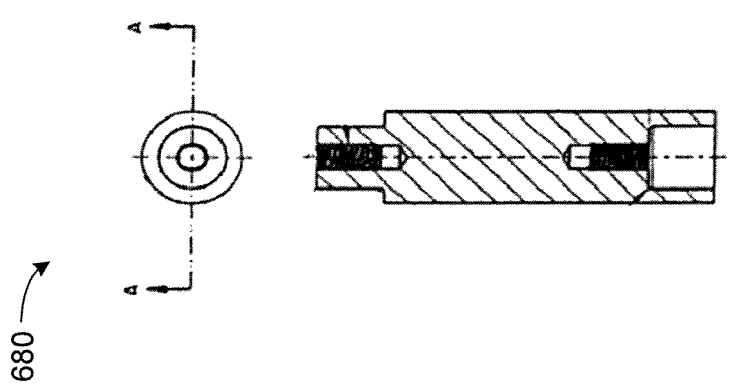
FIG. 25 is a cross-section of a female connector, in accordance with certain exemplary embodiments.
Figure 28:
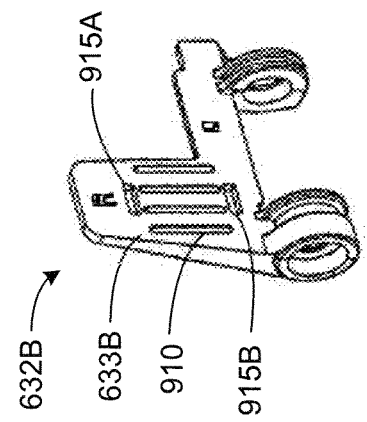
FIG. 28 is a front perspective view of the clamp arm illustrated in FIG. 27, in accordance with certain exemplary embodiments.
Figure 30:
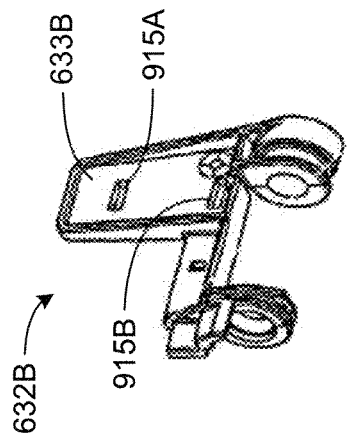
FIG. 30 is a rear perspective view of the clamp arm illustrated in FIG. 27, in accordance with certain exemplary embodiments
Figure 27:
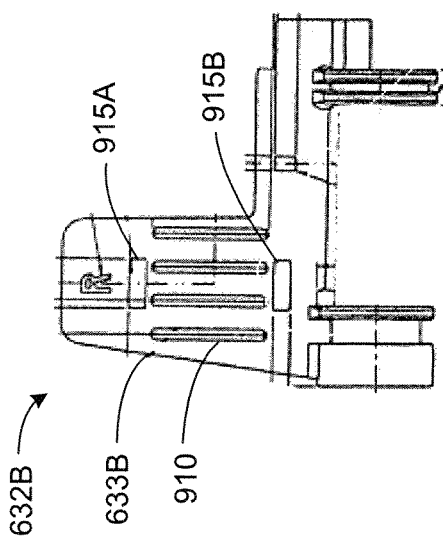
FIG. 27 is a front elevation view of a clamp arm of the monitoring device of FIG. 6, in accordance with certain exemplary embodiments.
Figure 29:
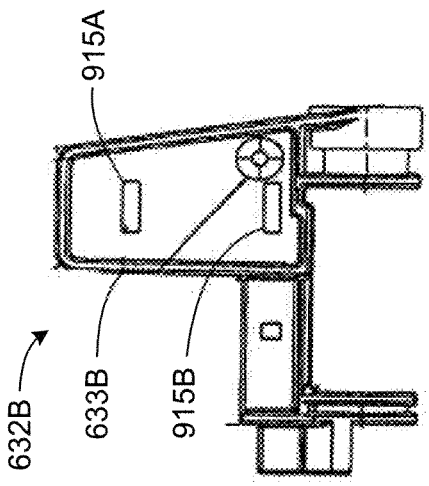
FIG. 29 is a rear elevation view of the clamp arm illustrated in FIG. 27, in accordance with certain exemplary embodiments.

As discussed above, the CT 610 is coupled to the housing 620. FIGS. 25 and 26 show mechanisms used to couple the CT 610 to the housing 620, in accordance with certain exemplary embodiments. In particular, FIG. 25 shows an exemplary female connector 680 that corresponds to each of the connectors 680A and 680B in FIG. 7. As set forth above, the connectors 680A and 680B may be used to couple the CT 610 to the housing 620 via the apertures 1015 and 1065 in the CT arms 612A and 612B, respectively. For example, the connector 680A can be used to couple the CT 610 to the housing 620 via the aperture 1015 in the CT arm 612A. Similarly, the connector 680B can be used to couple the CT 610 to the housing 620 via the aperture 1065 in the CT arm 612B. FIG. 26 shows the exemplary male connector 682 described above with reference to FIGS. 7 and 17-20.

FIGS. 27-31 illustrate the clamp atm 632B, in accordance with certain exemplary embodiments. With reference to FIGS. 8 and 27-31, the clamp arm 632B includes a clamp pad 633B that has clamp slots 910. When the monitoring device 600 is installed on a conductor 660 and the clamp arms 632A and 632B are closed around the conductor 660, the clamps pads 633A and 633B secure the monitoring device 600 to the conductor 660. The clamp slots 910 help to minimize the motion of the conductor 660 relative to the clamp aims 632A and 632B.

In certain exemplary embodiments, the clamp arm 632B includes apertures 915A and 915B for coupling one or more additional clamp pads 1505 (See FIGS. 31 and 32) to the clamp arm 632B, over the clamp pad 633B. This feature allows the monitoring device 600 to couple to conductors 660 of various sizes. For larger conductors 660, additional clamp pads 1505 may not be required. For smaller conductors 660, clamp pads 1505 of various different sizes may be installed onto the clamp arm 632B via the apertures 915A and 915B.

Figures 31, 32:
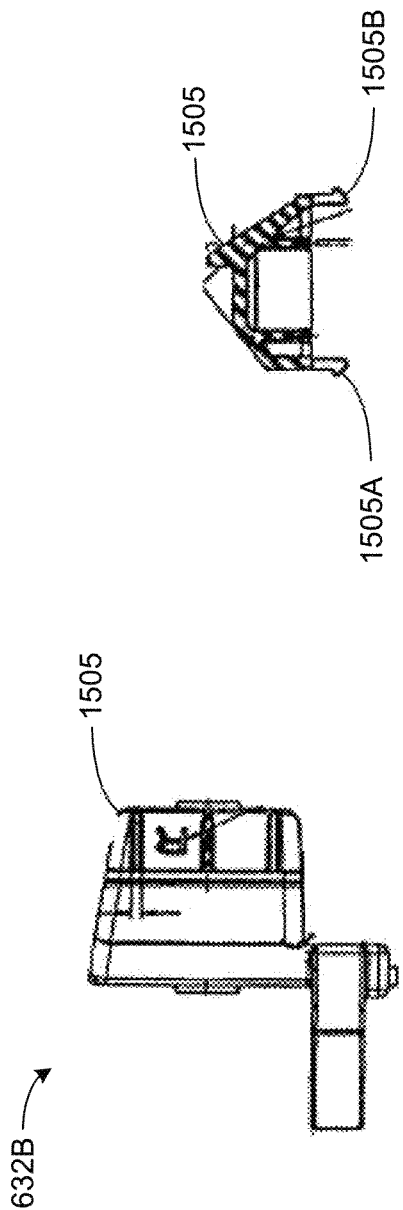
FIG. 31 is a front elevation view of a clamp pad of the clamp arm of FIG. 27, in accordance with certain exemplary embodiments.
FIG. 32 is a cross-sectional view of another clamp pad of the clamp arm illustrated in FIG. 27, in accordance with certain exemplary embodiments.

FIG. 31 is a front elevation view of a clamp pad 1505 coupled to the clamp arm 632B, in accordance with certain exemplary embodiments. FIG. 32 is a cross sectional view of the clamp pad 1505, in accordance with certain exemplary embodiments. With reference to FIGS. 8 and 31-32, the clamp pad 1505 includes tabs 1510A and 1510B that correspond to the apertures 915A and 915B on the clamp arm 632B. To allow the monitoring device 600 to be used with different sized conductors 660, the tabs 1510A and 1510B may be placed in various different positions that correspond to the appropriate dimensions of the conductor 660. In addition, or in the alternative, the clamp pad 1505 may be placed in various different positions that correspond to the appropriate dimensions of the conductor 660.

Figure 33:
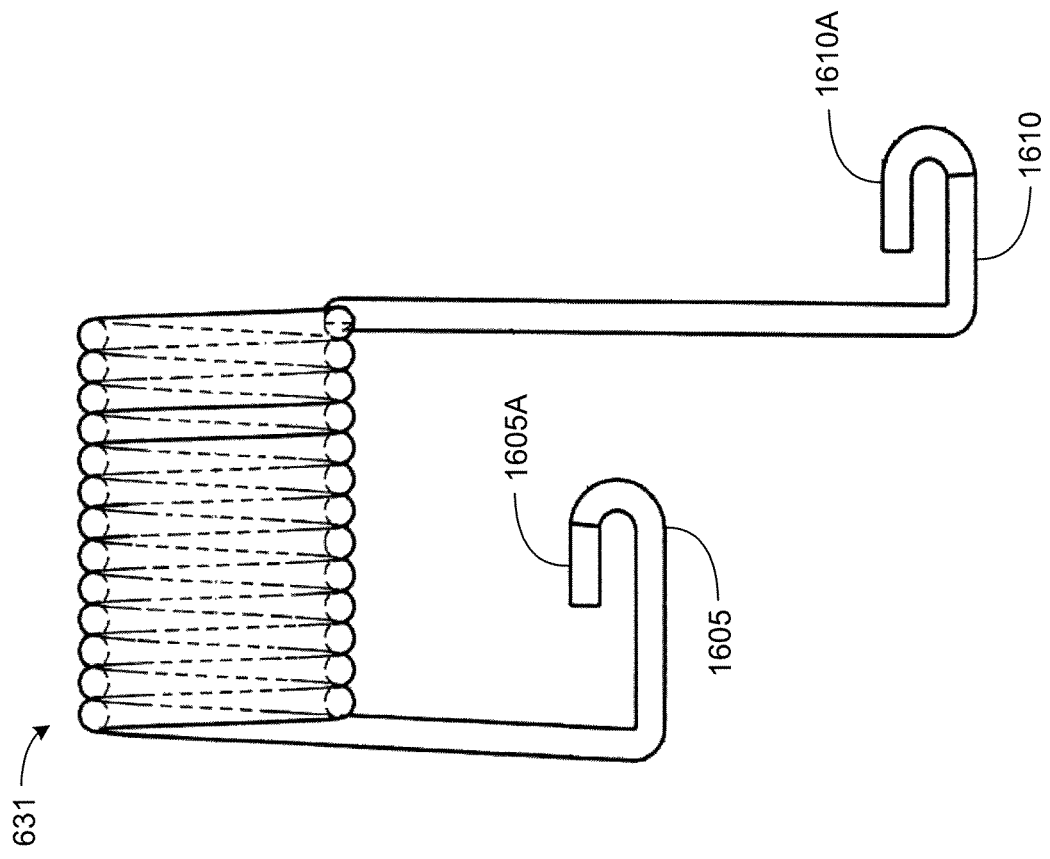
FIG. 33 is a side elevation view of a clamp spring of the monitoring device of FIG. 6, in accordance with certain exemplary embodiments.

FIG. 33 is a side elevation view of a clamp spring 631, such as clamp spring 631A or 631B of FIG. 8, in accordance with certain exemplary embodiments. The clamp spring 631 supplies at least a portion of the force required to move one of the clamp arms 632A and 632B into a closed position when the monitoring device 600 is installed. Each of the distal ends 1605 and 1610 of the clamp spring 631 includes a curved portion 1605A and 1610A, respectively. This curve provides reduced likelihood of electric interference from the clamp spring 631, as compared to clamp springs that have sharp ends. Although illustrated in FIG. 33 as including nearly 680 degree curves, a person of ordinary skill in the art having the benefit of the present disclosure will recognize that any degree curve may be used in each of the curved portions 1605A and 1610A.

FIGS. 34-37 illustrate a power line monitoring device 3400, in accordance with certain alternative exemplary embodiments. With reference to FIGS. 6-10 and 34-37, the monitoring device 3400 is substantially similar to the monitoring device 600 described above except that the antenna 3410 of the device 3400 extends from a side face 620A of the housing 620 and is electrically coupled to the conductor 660 (FIG. 8) via springs 611A and 3415.

As set forth above, when the monitoring device 3400 is installed on the conductor 660, the conductor 660 engages the spring 611A. The second end 611AB of the spring 611A is electrically coupled to a first end 3415A of the spring 3415. In certain exemplary embodiments, the ends 611AB and 3415A of the springs 611A and 3415, respectively, electrically engage one another by each being coupled to the spring connection 1075 (FIG. 19), substantially as described above (in connection with the end 611AB) with reference to FIG. 19.

A second end 3415B of the spring 3415 is electrically coupled to the antenna 3410 and/or one or more interior components of the monitoring device 3400. For example, in certain exemplary embodiments, the spring 3415 is electrically coupled to the circuit board 3405 of the monitoring device 3400. A fastener 3420, such as a mounting stud or bolt, extends through the side face 620A of the housing 620. For example, the fastener 3420 can be an antenna connector 655 that connects the antenna 3410 to the housing 620, substantially as described above with reference to FIG. 6. In certain alternative exemplary embodiments, the antenna 3410 can be disposed within the housing 610. In such embodiments, the fastener 3420 still may extend through the side face 620A to facilitate electrical coupling of the spring 3415 and the interior component(s) of the monitoring device 3400, substantially as described herein. The second end 3415B of the spring 3415 is coupled to a first end 3420A of the fastener 3420 that is disposed substantially outside the housing 620. A conductive connector 3425, such as a wire, is coupled to a second end 3420B of the fastener 3420 that is disposed substantially within the housing 620. The connector 3425 is coupled to the circuit board 3405 and/or one or more other components disposed within the housing 620. For example, the connector 3425 can be coupled to a ground reference point 3405A on the circuit board 3405. Generally, the monitoring device 3400 is mounted to the conductor 660 such that the monitoring device 3400 is "floating" without an Earth ground. The term "ground reference point" is used herein to refer to a circuitry reference point from which other voltages are measured, regardless of whether the reference point corresponds to Earth ground.

Thus, the antenna 3410, circuitry, and/or internal components of the monitoring device 3400 are electrically coupled to the conductor 660. This electrical coupling allows the device 3400 and the circuitry and antenna 3410 thereof to have substantially the same voltage potential as the potential of the conductor 660. Accordingly, there is a substantially equalized or uniform electric field around the monitoring device 3400. The substantially equal voltage potential and electric field allow communications with the monitoring device 600 to have reduced noise and interference, as compared to communicating power line monitoring devices that have different voltage potentials than the conductors 660 to which they are mounted. A person of ordinary skill in the art having the benefit of the present disclosure will recognize that many other means besides the springs 611A and 3415 and connector 3425 may be used to bring the antenna 3410, circuitry, and/or other internal components of the monitoring device 3400 to the line potential of the conductor 660 without departing from the spirit and scope of the invention. For example, one or more electrically conductive wires, pins, or other members could be used in place of the spring 3415 to electrically couple the spring 611A and the connector 3425 together.

When a user mounts the monitoring device 3400 to the conductor 660, the voltage potential of the monitoring device 3400 increases from a base voltage value to the voltage potential of the conductor 660. Generally, the increase is significant, on the order of a few hundred volts. An abrupt increase of significant voltage potential can cause the springs 611A and 3415 to develop electrical arcing or corona discharge, which can be harmful to the monitoring device 3400 and cause undesirable interference in communications with the monitoring device 3400.

Figure 37:
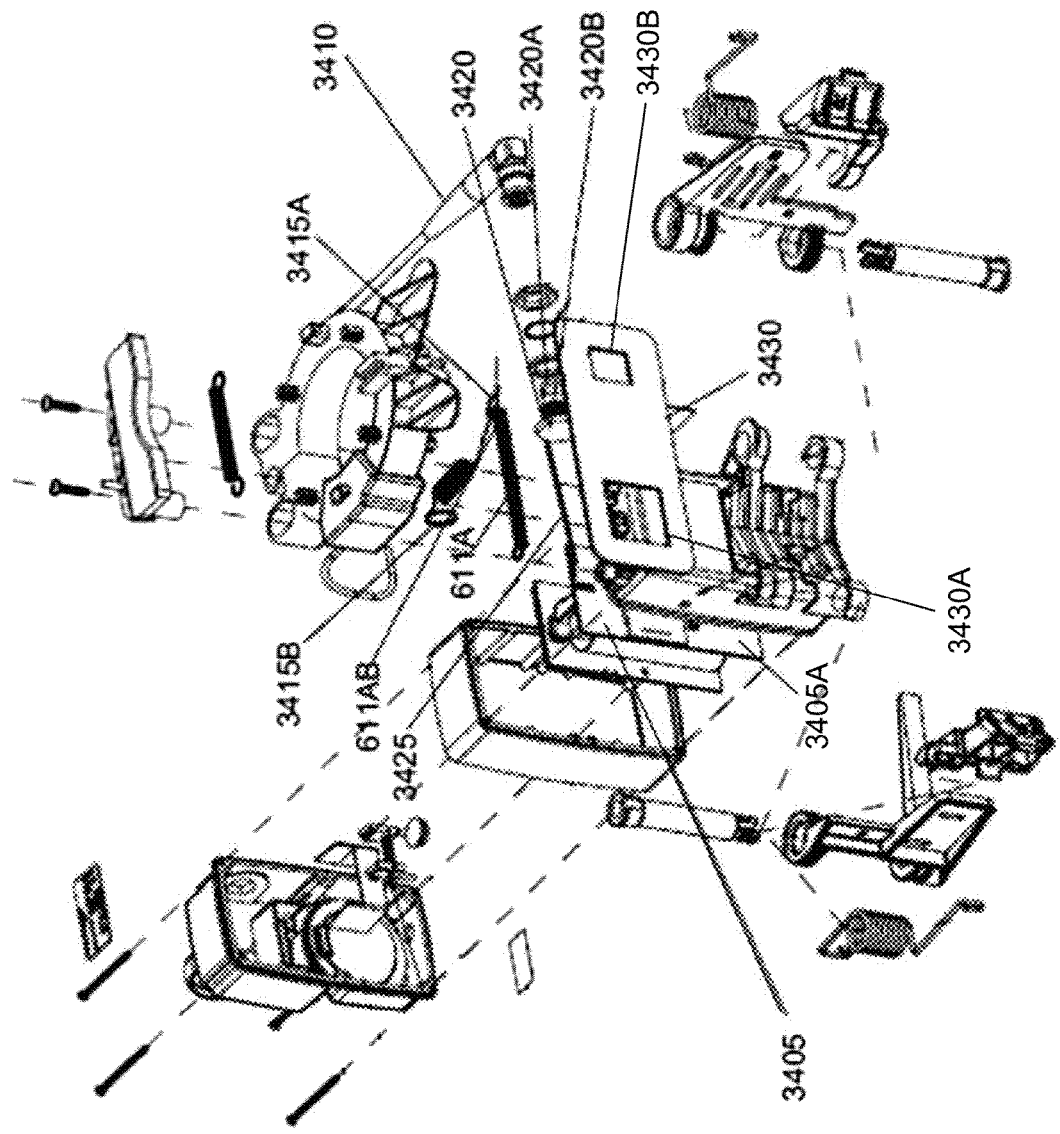
FIG. 37 is an exploded perspective side view of the monitoring device of FIG. 34, along with a semi-conductive interface pad, in accordance with certain exemplary embodiments.

In certain exemplary embodiments, as depicted in FIG. 37, the monitoring device 3400 includes a pad 3430, which is disposed between the conductor 660 and the spring 611A and slows down the rate of voltage potential change when the monitoring device 3400 is mounted to the conductor 660. The pad 3430 includes a substantially elongated sheet of semiconductive material that is electrically resistive. For example, the pad 3430 can have an electrical resistance of between about 7 and about 40 ohms/cm. Slowing down the rate of voltage potential change decreases or eliminates the likelihood of electrical arcing or corona discharge when mounting the device 3400 to the conductor 660. In certain exemplary embodiments, the pad 3430 includes apertures 3430A and 3430B through which the CT arms 612A and 612B, respectively, extend. Sizes and shapes of the apertures 3430 and/or flexibility of the material of the pad 3430 allows the CT arms 612A and 612B to open and close without adversely impacting the pad 3430.

Although specific embodiments have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of this disclosure, without departing from the spirit and scope of the invention defined in the following claims, the scope of which is to be accorded the broadest interpretation so as to encompass such modifications and equivalent structures.

What is claimed is:

1. An energy harvesting device for harvesting energy from a power line conductor, comprising:
   a current transformer comprising an electrical winding disposed thereon, the current transformer configured to receive an induced current on the electrical winding via magnetic flux energy generated by alternating current on the power line conductor, wherein the current transformer defines an opening having an axis that is perpendicular to and runs through the center of the opening;
   a housing comprising a first portion and a second portion, the first portion adjacent to the second portion along the axis, wherein the current transformer is disposed on the first portion;
   a clamping mechanism comprising clamp arms, each clamp arm being spring biased to maintain the clamp arm in a closed position, wherein the clamping mechanism is disposed on the second portion of the housing; and
   a circuit electrically coupled to the electrical winding and configured to convert the induced current into electrical energy for consumption by an electrical device.

2. The energy harvesting device of claim 1, wherein
   the current transformer comprises a current transformer spring and a substantially circular split core transformer comprising a first split core section and a second split core section, the split core transformer being biased by the current transformer spring to maintain a closed position and configured to provide the opening for disposing the power line conductor between the first and second split core sections.

3. The energy harvesting device of claim 2, wherein the first split core section comprises a first end surface and the second split core section comprises a second end surface whereby, when the split core transformer is installed on the power line conductor, the first end surface is proximal to the second end surface with an air gap separating the first end surface from the second end surface, the air gap being less than approximately 0.001 inches measured from the first end surface to the second end surface.

4. The energy harvesting device of claim 2, wherein
   the first split core section and the second split core section comprise an epoxy coating,
   the current transformer spring comprises two current transformer springs, and
   the first and second split core transformers comprise protrusions to attach the current transformer springs to the first and second split core transformers.

5. The energy harvesting device of claim 2, wherein the first split core section comprises one of grain oriented steel, supermalloy, permalloy, and ferrites and the second split core section comprises one of grain oriented steel, supermalloy, permalloy, and ferrites.

6. The energy harvesting device of claim 2, wherein the first split core section comprises a first projection disposed on a surface of the first split core section and extending outward from the split core transformer and the second split core section comprises a second projection disposed on a surface of the second split core section and extending outward from the split core transformer and wherein the first and second projections are operable to open the split core transformer when acted on by the power line conductor.

7. The energy harvesting device of claim 2, wherein each split core section further comprises an exit surface disposed on a surface of the interior diameter of the corresponding split core section, the exit surfaces operable to provide an opening between the split core sections when acted on by the power line conductor.

8. The energy harvesting device of claim 1, wherein the clamping mechanism releasably attaches the energy harvesting device to the power line conductor.

9. The energy harvesting device of claim 8, wherein the clamping mechanism further comprises an actuator arm that holds the clamp arms open against the spring bias before securing the energy harvesting device to the power line conductor.

10. The energy harvesting device of claim 9, wherein each clamp arm further comprises a clamp pad disposed within an aperture of the clamp arm, each clamp pad being selected based on a size of the power line conductor.

11. The energy harvesting device of claim 1, wherein the circuit comprises a pre-regulator circuit configured to receive the induced current from the electrical winding of the current transformer and develop a voltage matched to a power curve of the current transformer.

12. The energy harvesting device of claim 11, wherein the circuit further comprises a switching regulator circuit coupled to an output of the pre-regulator circuit and operable to regulate the voltage to a voltage level appropriate for the electrical device.

13. The energy harvesting device of claim 12, wherein the circuitry further comprises an energy storage device coupled to an output of the switching regulator circuit that stores energy from the switching regulator circuit, the energy storage device operable to power the electrical device when the switching regulator circuit is not producing sufficient energy to power the electrical device.

14. A method for powering an electrical device using energy captured from a power line conductor by a current transforming harvester (CTH), comprising:
   releasing a spring bias of clamp arms that attach the CTH to the power line conductor, wherein the clamp arms are disposed on a second portion of a housing;
   receiving an induced alternating current on an electrical winding of a current transformer of the CTH via magnetic flux energy generated by alternating current flowing on the power line conductor, wherein the current transformer is disposed on a first portion of the housing, wherein the first portion is adjacent to the second portion of the housing along an axis, the axis perpendicular to and running through the center of an opening defined by the current transformer;
   rectifying, by a rectifier circuit, the induced alternating current into a direct current; and
   regulating, by a switching regulator, a voltage level of the electrical device based on the direct current.

15. The method of claim 14, further comprising attaching the CTH to the power line conductor while the power line conductor is energized.

16. The method of claim 15, wherein the current transformer comprises a substantially circular split core transformer comprising a first split core section and a second split core section, the split core transformer configured to provide the opening for disposing the power line conductor between the first and second split core sections, whereby the split core transformer encircles the power line conductor when installed thereto.

17. The method of claim 15, wherein
   the first split core section comprises a first projection disposed on a surface of the first split core section and extending outward from the split core transformer and the second split core section comprises a second projection disposed on a surface of the second split core section and extending outward from the split core transformer,
   the first and second projections form a V shape area at proximal ends of the projections, and
   the step of attaching the CTH to the power line conductor comprises pressing the V shape area against the power line conductor and opening the split core transformer to allow the power line conductor to enter a cavity encircled by the split core transformer.

18. The method of claim 15, wherein the CTH comprises a clamping, and releasing the spring bias comprises securing the power line conductor between the clamp arms.

19. The method of claim 18, further comprising
   arranging the clamping mechanism into an open position whereby the clamp arms are spread apart to create an opening for the power line conductor, the clamp arms being held in the open position by an actuator arm; and
   closing the clamp arms onto the power line by pressing the actuator arm against the power line conductor to release the actuator arm, thereby releasing the spring bias and allowing the clamp arms to close into a position holding the power line conductor against a body of the clamping mechanism.

20. The method of claim 14, further comprising charging an energy storage device using an output of the switching regulator.

21. The method of claim 14, further comprising developing a voltage matched to a power curve of the current transformer prior to the step of regulating the voltage level by the switching regulator.

22. An energy harvesting device for harvesting energy from a power line conductor, comprising:
   a current transformer comprising an electrical winding disposed thereon, the current transformer configured to receive an induced current on the electrical winding, wherein the current transformer defines an opening having an axis that is perpendicular to and runs through the center of the opening;
   a housing comprising a first portion and a second portion, the first portion adjacent to the second portion along the axis, wherein the current transformer is disposed on the first portion;
   a clamping mechanism comprising spring biased clamp arms, wherein the clamping mechanism is disposed on the second portion of the housing;
   a circuit electrically coupled to the electrical winding and configured to convert the induced current into electrical energy for consumption by an electrical device; and
   a conductive path between the power line conductor and the electrical device to provide a reference voltage for the electrical device.

23. The energy harvesting device of claim 22, wherein
   the current transformer comprises a current transformer spring and a substantially circular split core transformer spring biased by the current transformer spring to maintain a closed position, and
   the conductive path between the power line conductor and the electrical device comprises the current transformer spring.

24. The energy harvesting device of claim 22, wherein the clamping mechanism further comprises an actuator arm that holds the clamp arms open against the spring bias before securing the energy harvesting device to the power line conductor.

* * * * *